(12) United States Patent
Chen et al.

(10) Patent No.: US 7,989,795 B2
(45) Date of Patent: Aug. 2, 2011

(54) PHASE CHANGE MEMORY DEVICE AND METHOD FOR FABRICATING THE SAME

(75) Inventors: Wei-Su Chen, Hsinchu (TW); Yi-Chan Chen, Yunlin County (TW); Hong-Hui Hsu, Changhua County (TW); Chien-Min Lee, Kaohsiung (TW); Der-Sheng Chao, Taichung County (TW); Chih Wei Chen, Miaoli County (TW); Ming-Jinn Tsai, Hsinchu (TW)

(73) Assignees: ProMOS Technologies Inc., Hsinchu (TW); Nanya Technology Corporation, Taoyuan (TW); Winbond Electronics Corp., Taichung County (TW)

( * ) Notice: Subject to any disclaimer, the term of this patent is extended or adjusted under 35 U.S.C. 154(b) by 517 days.

(21) Appl. No.: 11/857,396

(22) Filed: Sep. 18, 2007

(65) Prior Publication Data
US 2008/0164504 A1 Jul. 10, 2008

(30) Foreign Application Priority Data
Jan. 10, 2007 (TW) .............................. 96101167 A

(51) Int. Cl.
*H01L 29/04* (2006.01)
(52) U.S. Cl. ............. 257/3; 257/4; 257/5; 257/E29.234; 257/E47.005; 438/102
(58) Field of Classification Search .................. 257/2, 3, 257/4, 5, 246, E29.234, E45.002, 248, E47.005; 438/3, 95, 102, 637–639, 479; 365/129–188
See application file for complete search history.

(56) References Cited

U.S. PATENT DOCUMENTS

| | | | |
|---|---|---|---|
| 6,501,111 B1 | 12/2002 | Lowrey | |
| 7,012,273 B2 * | 3/2006 | Chen | 257/4 |
| 7,244,956 B2 * | 7/2007 | Pellizzer | 257/2 |
| 7,456,421 B2 * | 11/2008 | Lung | 257/5 |
| 2003/0193063 A1 * | 10/2003 | Chiang et al. | 257/295 |
| 2004/0087074 A1 * | 5/2004 | Hwang et al. | 438/198 |
| 2004/0211988 A1 | 10/2004 | Chen | |
| 2004/0232475 A1 | 11/2004 | Kataoka et al. | |
| 2005/0122771 A1 * | 6/2005 | Chen | 365/163 |
| 2007/0097738 A1 * | 5/2007 | Asano et al. | 365/163 |
| 2007/0105267 A1 * | 5/2007 | Karpov et al. | 438/95 |
| 2007/0298535 A1 * | 12/2007 | Lung | 438/102 |
| 2008/0094873 A1 * | 4/2008 | Lai et al. | 365/148 |

FOREIGN PATENT DOCUMENTS

| | | |
|---|---|---|
| CN | 1992326 A | 7/2007 |
| EP | 1339111 A1 | 8/2003 |

* cited by examiner

*Primary Examiner* — Colleen Matthews
*Assistant Examiner* — Yosef Gebreyesus

(57) ABSTRACT

A phase change memory device is provided. The phase change memory device comprises a substrate. An electrode layer is on the substrate. A phase change memory structure is on the electrode layer and electrically connected to the electrode layer, wherein the phase change memory structure comprises a cup-shaped heating electrode on the electrode layer. An insulating layer is on the cup-shaped heating electrode along a first direction covering a portion of the cup-shaped heating electrode. An electrode structure is on the cup-shaped heating electrode along a second direction covering a portion of the insulating layer and the cup-shaped heating electrode. A pair of double spacers is on a pair of sidewalls of the electrode structure covering a portion of the cup-shaped heating electrode, wherein the double spacer comprises a phase change material spacer and an insulating material spacer on a sidewall of the phase change material spacer.

40 Claims, 36 Drawing Sheets

PHASE CHANGE MEMORY DEVICE AND METHOD FOR FABRICATING THE SAME

BACKGROUND OF THE INVENTION

1. Field of the Invention

The invention relates to a phase change memory device and method for fabricating the same, and more particularly to a phase change memory device with relatively higher device density and a method for fabricating the same.

2. Description of the Related Art

A phase change memory (PCM) device may potentially serve as a 64-megabyte (MB) or greater stand-alone non-volatile memory. Before PCM devices become a mainstream replacement for flash memory, however, they must first achieve excellent electrical and thermal performance. Fabrication of non-volatile memory with relatively higher device density using the conventional fabrication process is, thus, a major aim of researchers.

U.S. Pat. No. 6,501,111 issued by Intel Corporation discloses a conventional three-dimensional PCM (3D-PCM) 212 with a cup-shaped bottom electrode 206 as shown in FIG. 1a. A contact area between a phase change material 207 and a bottom electrode can serve as a contact area between the phase change material 207 and a width of the cup-shaped bottom electrode 206, thus, device density can be increased. A bottleneck occurs, however, when minimizing the device area during a conventional fabrication process, thus, such a process is unsuitable for a photolithography process with a critical dimension (CD) below 0.1 µm. EP Pat. No. 1339111 issued by ST Microelectronics (STM) Corporation discloses a PCM formed by filling a phase change material into a contact hole 57 with a nano-level CD or a minitrench 58 to reduce the contact area 58 between the phase change material and a cup-shaped heating electrode 22, thus, higher device density can be achieved. If the CD of the contact hole is too small to be filled with phase change material, however, a seam problem occurs.

A PCM device with a higher device density, not limited by photolithography resolution is thus desirable.

BRIEF SUMMARY OF INVENTION

A detailed description is given in the following embodiments with reference to the accompanying drawings.

The invention provides a phase change memory device and method for fabricating the same. An embodiment of a phase change memory device comprises a substrate; an electrode layer formed on the substrate; a phase change memory structure formed on the electrode layer and electrically connected to the electrode layer, wherein the phase change memory structure comprises a cup-shaped heating electrode placed on the electrode layer; an insulating layer placed on the cup-shaped heating electrode along a first direction covering a portion of the cup-shaped heating electrode; an electrode structure placed on the cup-shaped heating electrode along a second direction covering a portion of the insulating layer and the cup-shaped heating electrode; a pair of double spacers placed on a pair of sidewalls of the electrode structure covering a portion of the cup-shaped heating electrode, wherein the double spacer comprises a phase change material spacer and an insulating material spacer placed on a sidewall of the phase change material spacer.

An embodiment of a method of fabricating a phase change memory device comprises providing a substrate with an electrode layer formed thereon; forming a phase change memory structure on the electrode layer and electrically connected to the electrode layer, wherein the phase change memory structure comprises forming a cup-shaped heating electrode on the electrode layer; forming an insulating layer on the cup-shaped heating electrode along a first direction and covering a portion of the cup-shaped heating electrode; forming an electrode structure along a second direction and covering a portion of the insulating layer and the cup-shaped heating electrode; and forming a pair of double spacers on a pair of sidewalls of the electrode structure and covering a portion of the cup-shaped heating electrode, wherein the double spacer comprises a phase change material spacer and an insulating material spacer placed on a sidewall of the phase change material spacer.

Another embodiment of a phase change memory device comprises a substrate; an electrode layer formed on the substrate; a dielectric layer formed on the electrode layer; a phase change memory structure formed in the dielectric layer and electrically connected to the electrode layer, wherein the phase change memory structure comprises a cup-shaped heating electrode placed in a cup-shaped opening in the dielectric layer, wherein the cup-shaped heating electrode comprises a conductive layer covering a portion of a sidewall of the cup-shaped heating electrode; an electrode structure placed on the cup-shaped heating electrode and covering a portion of the cup-shaped heating electrode; a pair of double spacers placed on a pair of sidewalls of the electrode structure and covering a portion of the cup-shaped heating electrode, wherein the double spacer comprises a phase change material spacer and an insulating material spacer placed on a sidewall of the phase change material spacer.

Another embodiment of a method of fabricating a phase change memory device comprises providing a substrate with an electrode layer formed thereon; forming a dielectric layer on the electrode layer; forming a phase change memory structure in the dielectric layer and electrically connected to the electrode layer, wherein the phase change memory structure comprises forming a cup-shaped heating electrode in a cup-shaped opening in the dielectric layer, wherein the cup-shaped heating electrode comprises a conductive layer covering a portion of a sidewall of the cup-shaped heating electrode; forming an electrode structure on the cup-shaped heating electrode covering a portion of the cup-shaped heating electrode; forming a pair of double spacers on a pair of sidewalls of the electrode structure and covering a portion of the cup-shaped heating electrode, wherein the double spacer comprises a phase change material spacer and an insulating material spacer placed on a sidewall of the phase change material spacer.

BRIEF DESCRIPTION OF DRAWINGS

The invention can be more fully understood by reading the subsequent detailed description and examples with references made to the accompanying drawings, wherein:

FIG. 15d shows cross sections taken along line C-C' of FIG. 15a.

DETAILED DESCRIPTION OF INVENTION

Figure 1A:
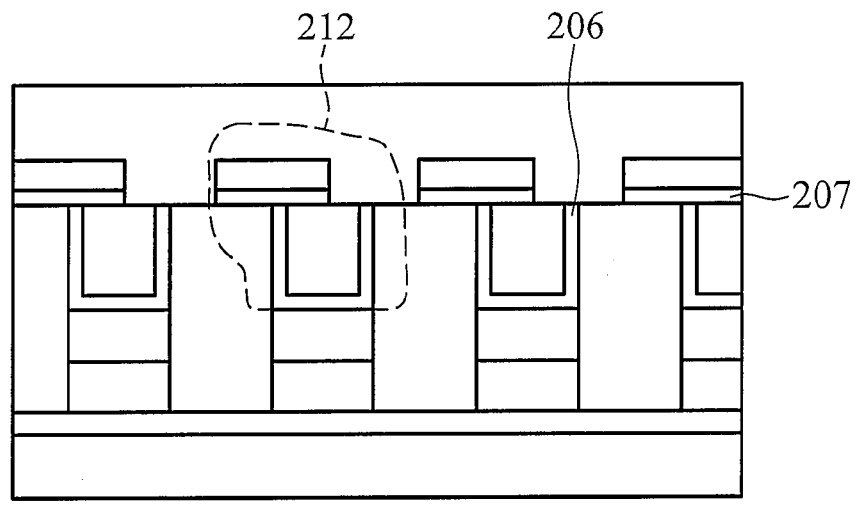
FIGS. 1a and 1b show conventional phase change memory devices.
Figure 1B:
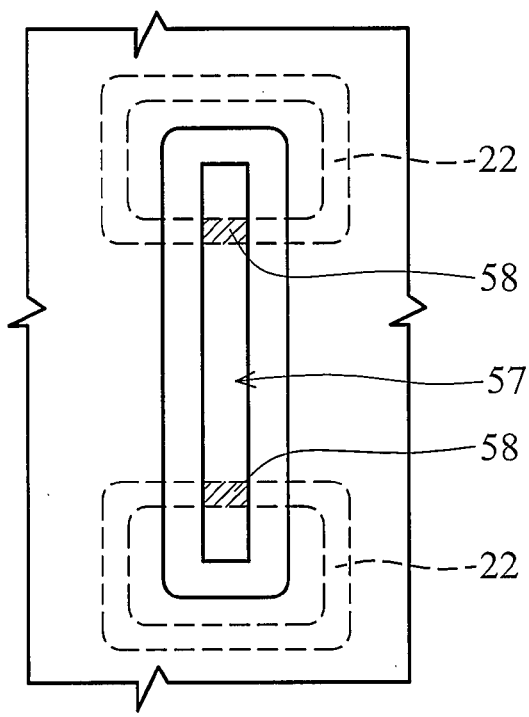

The following description is of the mode of carrying out the invention. This description is made for the purpose of illustrating the general principles of the invention and should not be taken in a limiting sense. The scope of the invention is best determined by reference to the appended claims.

FIGS. 2a, 3a, 4a, 5a, 6a, 7a, 8a, 9a, 10a, 11a, 12a, 13a, 14a and 15a show top views of a first embodiment of a phase change memory device. FIGS. 16a, 17a, 18a, 19a, 20a, 21a, 22a, 23a, 24a, 25a, 26a and 27a show top views of a second embodiment of a phase change memory device. FIGS. 2b, 3b, 4b, 5b, 6b, 7b, 8b, 9b, 10b, 11b, 12b, 13b, 14b and 15b show cross sections taken along line A-A' of FIGS. 2a, 3a, 4a, 5a, 6a, 7a, 8a, 9a, 10a, 11a, 12a, 13a, 14a and 15a, respectively. FIGS. 16b, 17b, 18b, 19b, 20b, 21b, 22b, 23b, 24b, 25b, 26b and 27b show cross sections taken along line A-A' of FIGS. 16a, 17a, 18a, 19a, 20a, 21a, 22a, 23a, 24a, 25a, 26a and 27a, respectively. FIGS. 10c, 14c and 15c show cross sections taken along line B-B' of FIGS. 10a, 14a and 15a, respectively. FIGS. 19c, 20c, 21c, 22c, 23c and 27c show cross sections taken along line B-B' of FIGS. 19a, 20a, 21a, 22a, 23a and 27a, respectively. FIG. 15d shows cross sections taken along line C-C' of FIG. 15a. Wherever possible, the same reference numbers are used in the drawings and the descriptions of the same or like parts.

First Embodiment

Figure 2A:
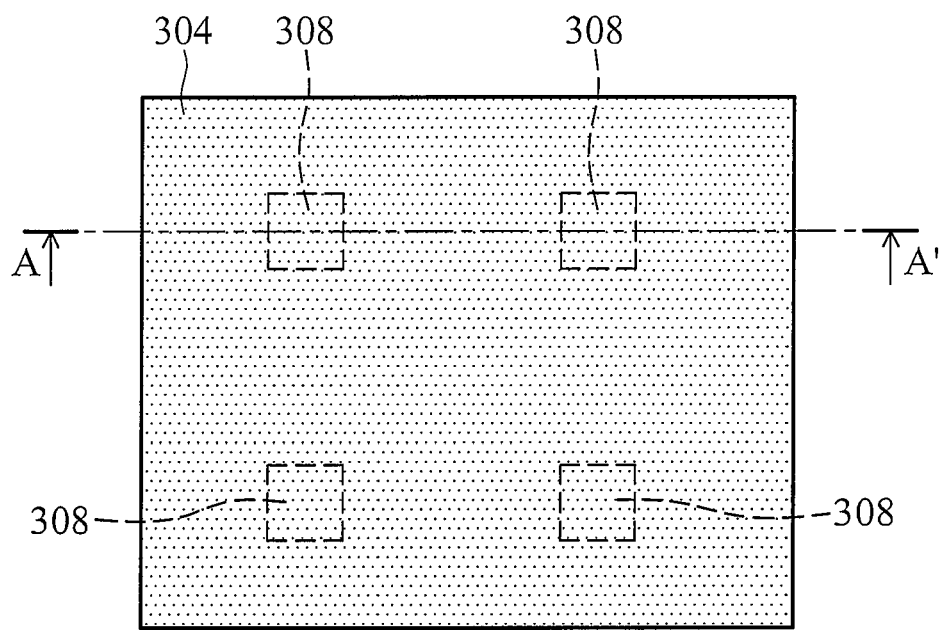
FIGS. 2a, 3a, 4a, 5a, 6a, 7a, 8a, 9a, 10a, 11a, 12a, 13a, 14a and 15a show top views of a first embodiment of a phase change memory device.
Figure 2B:
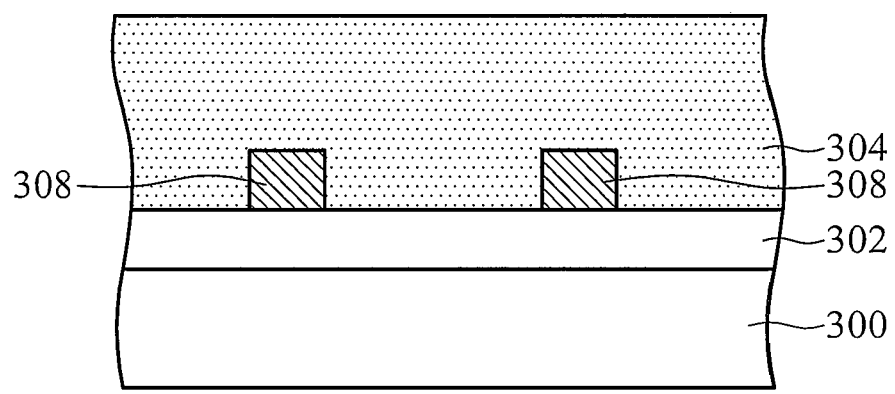
FIGS. 2b, 3b, 4b, 5b, 6b, 7b, 8b, 9b, 10b, 11b, 12b, 13b, 14b and 15b show cross sections taken along line A-A' of FIGS. 2a, 3a, 4a, 5a, 6a, 7a, 8a, 9a, 10a, 11a, 12a, 13a, 14a and 15a, respectively.

FIG. 2a illustrates a top view of a first embodiment of a phase change memory device. FIG. 2b shows a cross section of the phase change memory device taken along line A-A' of FIG. 2a. A substrate 300 is provided. The substrate 300 may comprise silicon. In alternative embodiments, SiGe, bulk semiconductor, strained semiconductor, compound semiconductor, silicon on insulator (SOI), and other commonly used semiconductor substrates can be used for the substrate 300. The substrate 300 may be a substrate comprising transistors, diodes, bipolar junction transistors (BJT), resistors, capacitors, inductors or other electrical elements. Next, an electrode layer 302, serving as bottom electrode layer 302, is formed on the substrate 300 by a deposition process, such as, physical vapor deposition (PVD), sputtering, low pressure chemical vapor deposition (LPCVD), atomic layer chemical vapor deposition (ALD) or electroless plating. The electrode layer 302 may comprise polysilicon, amorphous silicon, metal nitride or metal silicide. The electrode layer 302 may also comprise metals or alloys. The electrode layer 302 may also comprise cobalt (Co), tantalum (Ta), nickel (Ni), titanium (Ti), tungsten (W), TiW, other refractory metals, composite metals or basic metals such as aluminum (Al) or copper (Cu). The electrode layer 302 may be a single layer or a composite layer, for example, Al layer, Cu/TaN layer or other single metal layer or composite metal layer.

Next, a switching element 308 is formed on the electrode layer 302. The switching element 308 is an optional element comprising a diode structure or an interconnect structure. In one embodiment, a p-type semiconductor layer and an n-type semiconductor layer (not shown) are formed on the electrode layer 302 by thin film deposition such as CVD. A portion of the p-type semiconductor layer and an n-type semiconductor are then removed to form the switching element 308 of a diode structure by photolithography and etching processes. Alternatively, the switching element 308, referred to as an interconnect structure, is formed by filling metal into a contact hole or a via hole. The switching element 308 may be a composite layer with polycrystalline or amorphous semiconductor, for example, polysilicon or amorphous silicon. The switching element 308 may be a p-n junction stacking by an n-type impurity doped semiconductor layer and a p-type impurity doped semiconductor layer. The n-type impurity may comprise phosphorous (P) or arsenic (As), and the p-type impurity may comprise boron (B) or difluoroborane ($BF_2$). In the alternative embodiment, the switching element 308 may comprise metal.

Next, a dielectric layer 304 is formed on the electrode layer 302 and the switching element 308 by thin film deposition such as CVD. The dielectric layer 304 may comprise silicon oxide ($SiO_x$), silicon nitride ($SiN_y$) or the like.

Figure 3A:
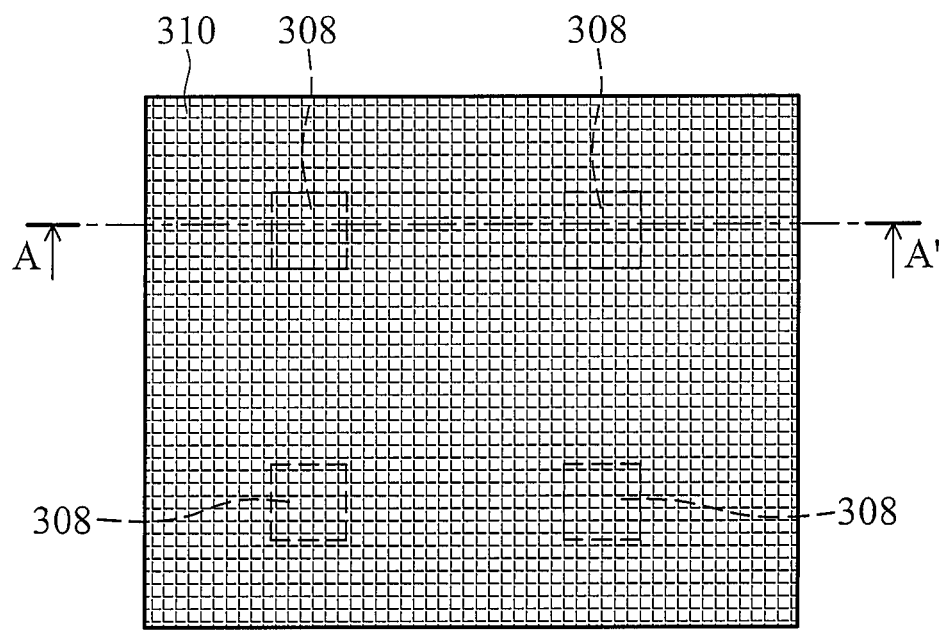
Figure 3B:
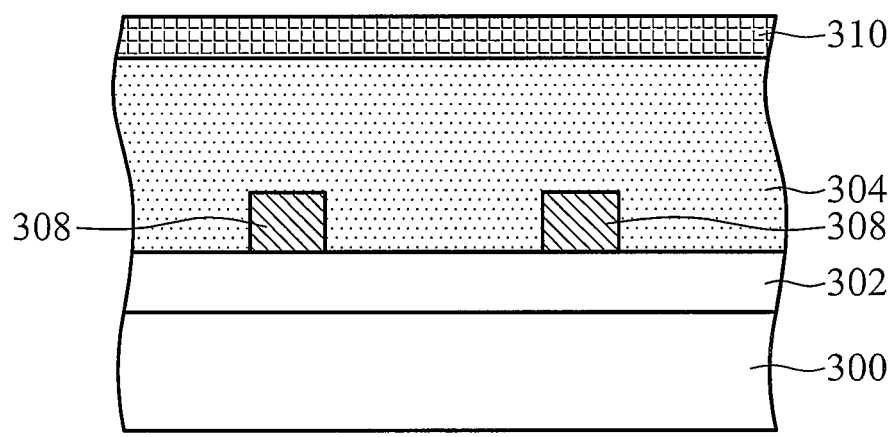

FIGS. 3a and 3b illustrate a formation of a hard masking layer 310. The hard masking layer 310 such as silicon nitride is entirely formed on the dielectric layer 304. The hard masking layer 310 has a thickness of about 50 nm to 200 nm, preferably of about 100 nm.

Figure 4A:
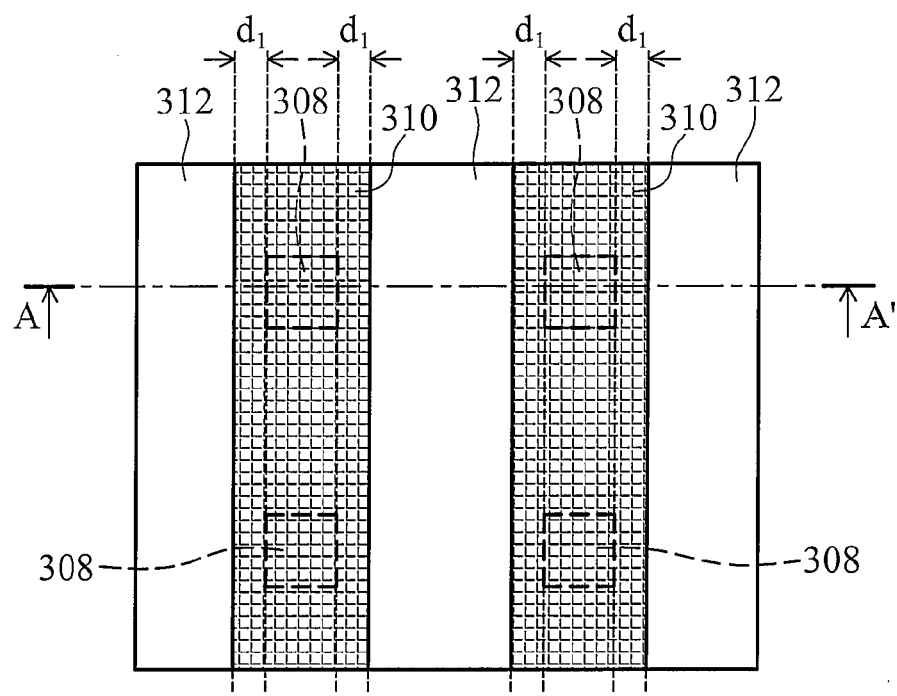
Figure 4B:
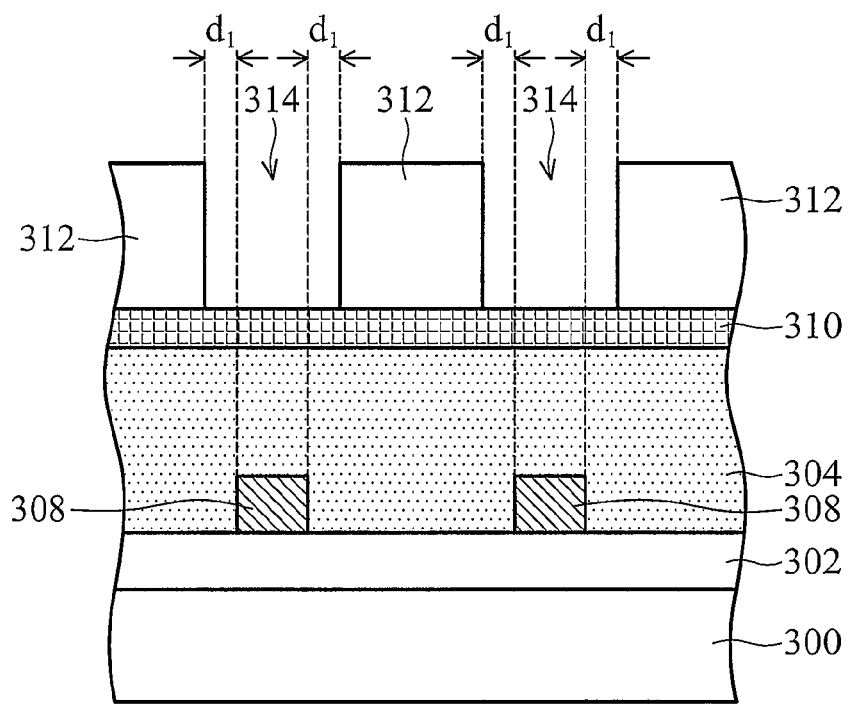
Figure 5A:
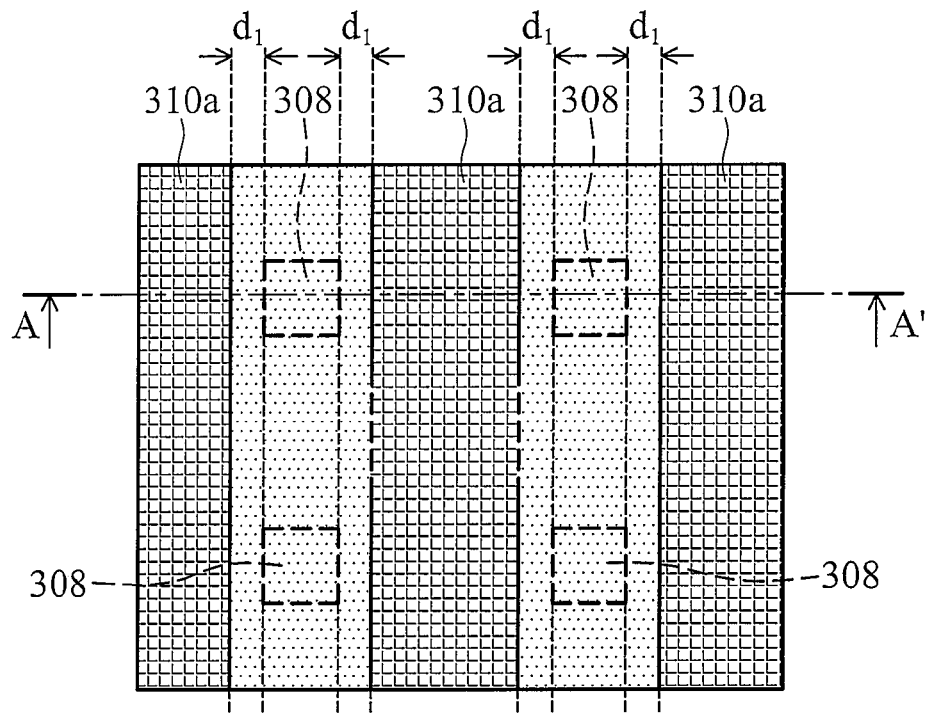
Figure 5B:
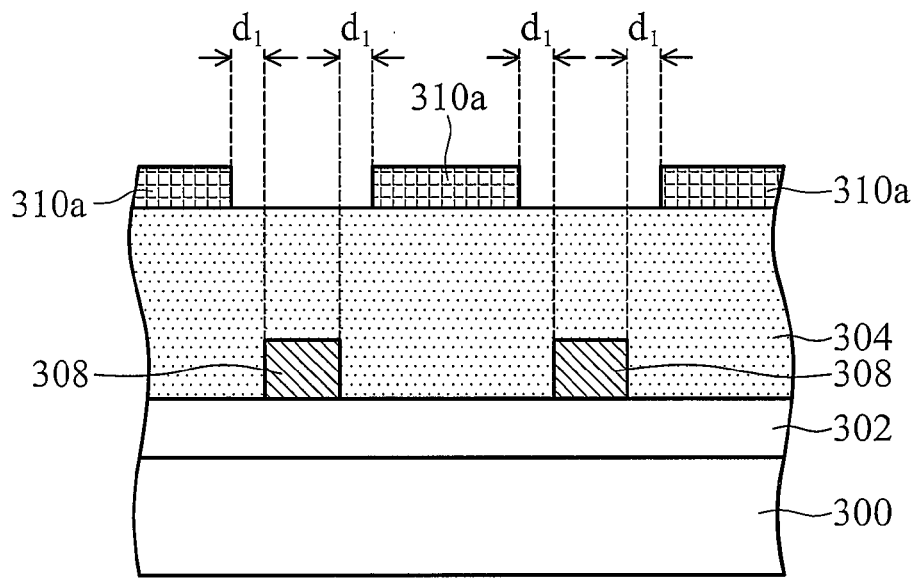

The hard masking layer 310 is covered by a photoresist layer 312 as shown in FIGS. 4a and 4b. Sidewalls of the photoresist layer 312 are separated from a set of sidewalls of the switching element 308 by a first distance $d_1$. The photoresist layer 312 has a thickness of about 400 nm to 600 nm, preferably of about 500 nm. Referring to FIGS. 5a and 5b, an anisotropic etching is then performed to remove the hard masking layer 310 not covered by the photoresist layer 312. Next, the photoresist layer 312 is removed to form a plurality of hard masking layers 310a. Sidewalls of the hard masking layers 310a are also separated from a set of sidewalls of the switching element 308 by a first distance $d_1$. Spacing between the adjacent hard masking layers 310a is controlled by the critical distance (CD) resolution of photolithography without dimension limitation.

Figure 6A:
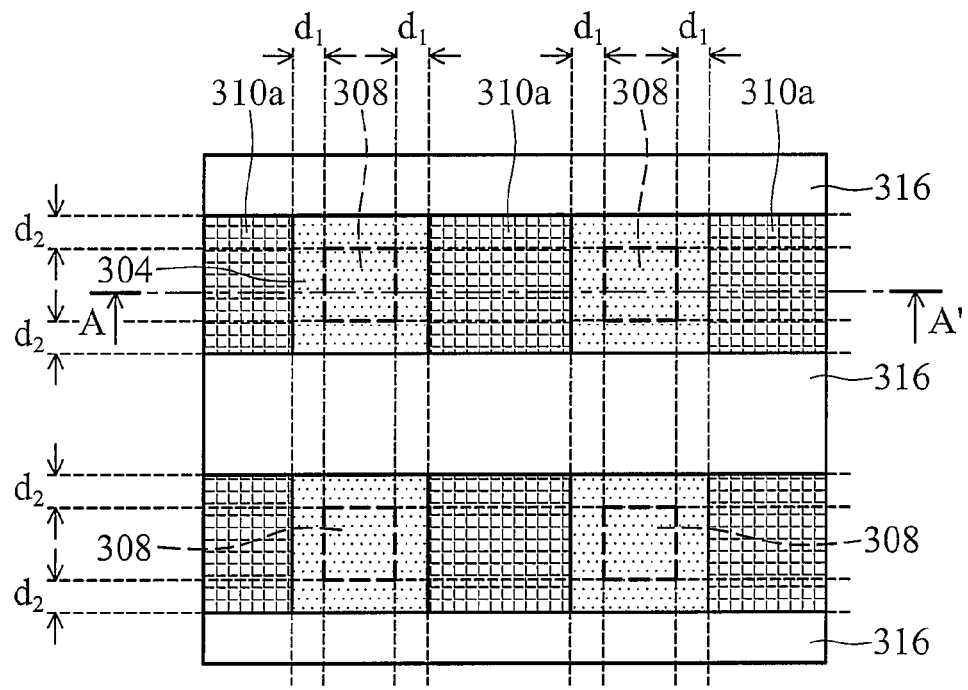
Figure 6B:
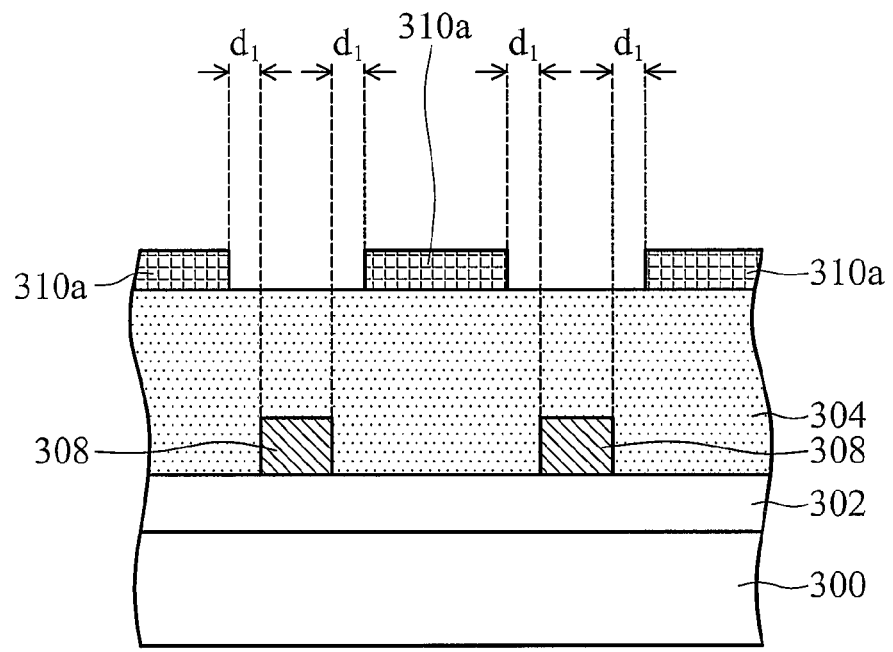

Referring to FIGS. 6a and 6b, a plurality of photoresist layers 316 are formed on the hard masking layers 310a and perpendicular to the hard masking layers 310a. Spacing between the adjacent photoresist layers 316 is controlled by the critical distance (CD) resolution of photolithography without substantial limitation of dimension. Sidewalls of the photoresist layers 316 are separated from another set of sidewalls of the switching element 308 by a second distance $d_2$. In the first embodiment, the first distance $d_1$ may be equal to the second distance $d_2$ to form a square contact hole. The first distance $d_1$ may be different from the second distance $d_2$ to form a rectangular contact hole. Alternatively, the first distance $d_1$ and the second distance $d_2$ may be negative showing an area of the switching element 308 to be greater than an area of the contact hole from the top.

Figure 7A:
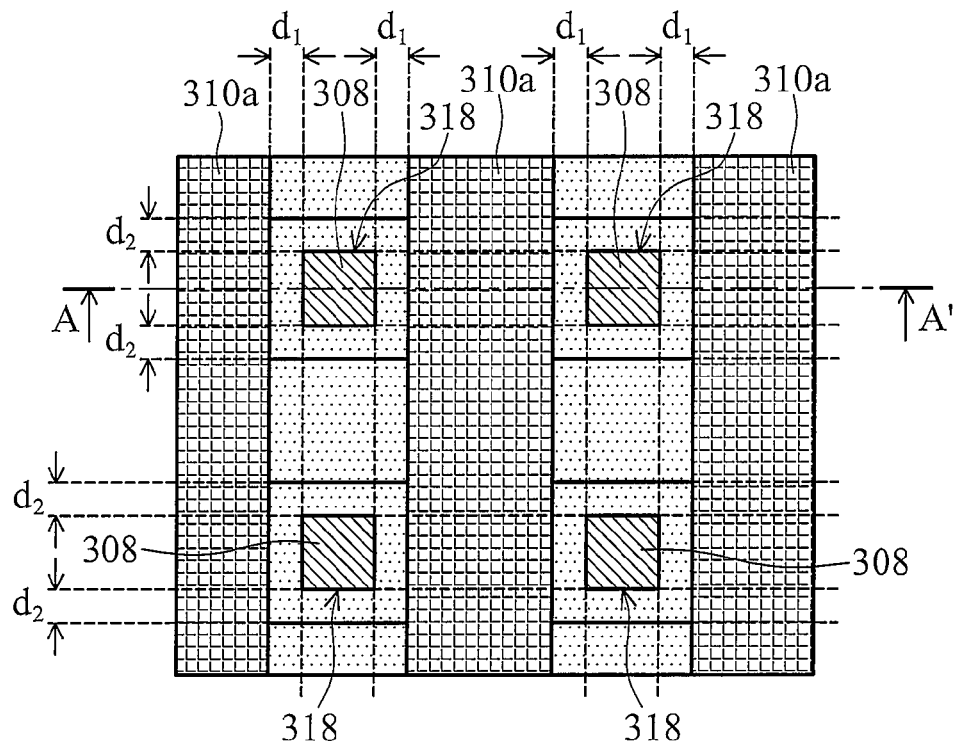
Figure 7B:
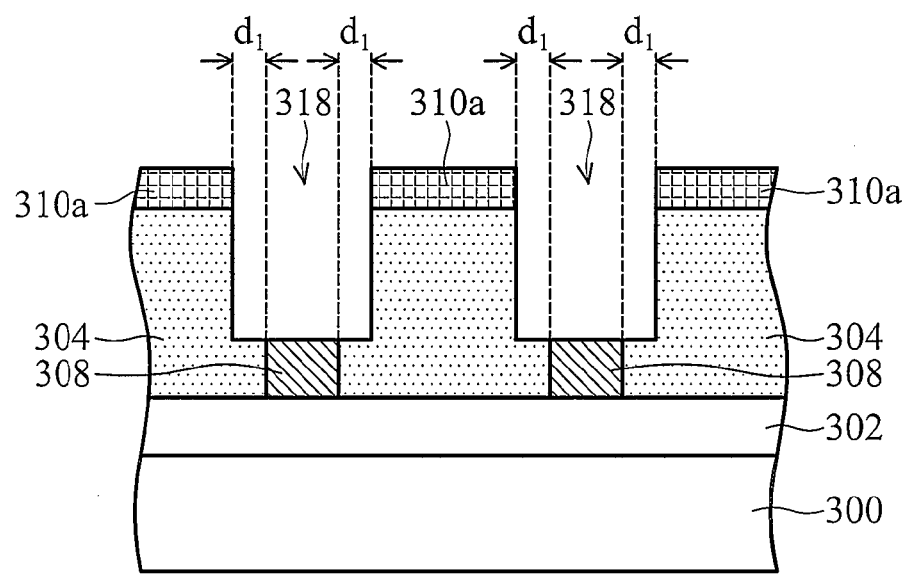

Referring to FIGS. 7a and 7b, an anisotropic etching is then performed to remove a portion of the dielectric layer 304 until the switching element 308 is exposed using the hard masking layers 310a and the photoresist layers 316 as masks. Next, the photoresist layer 316 is removed to form a cup-shaped opening 318 with a bottom aligned to the top of the switching element 308. In one embodiment, the hard masking layers 310a preferably have an etching selectivity greater than 5 with the dielectric layer 304. The cup-shaped opening 318 is square from the top view as shown in FIG. 7a. An aperture of the cup-shaped opening 318 is related to a thickness of the subsequently formed phase change material spacers. In the first embodiment, the aperture of the cup-shaped opening 318 is of about 10 nm to 500 nm, preferably of about 480 nm.

Figure 8A:
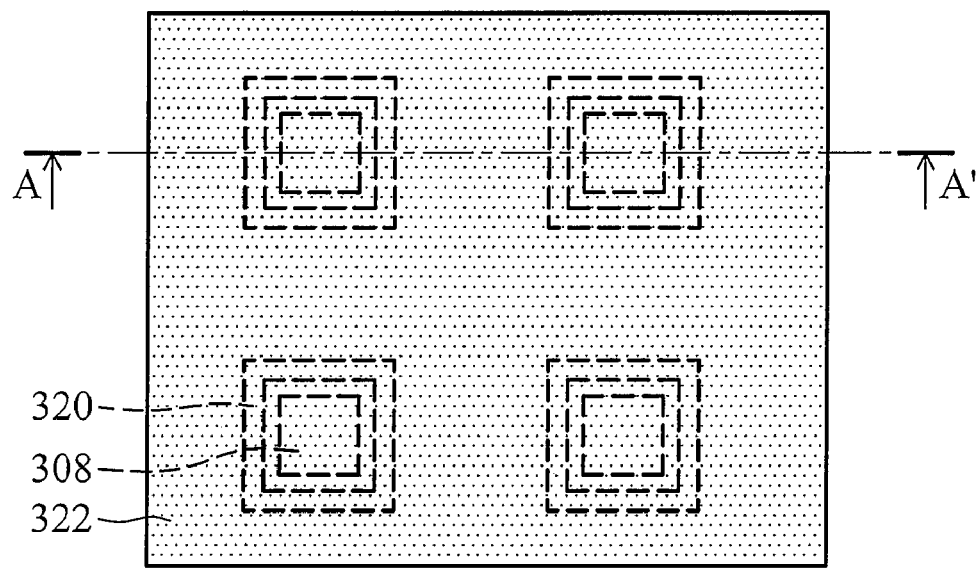
Figure 8B:
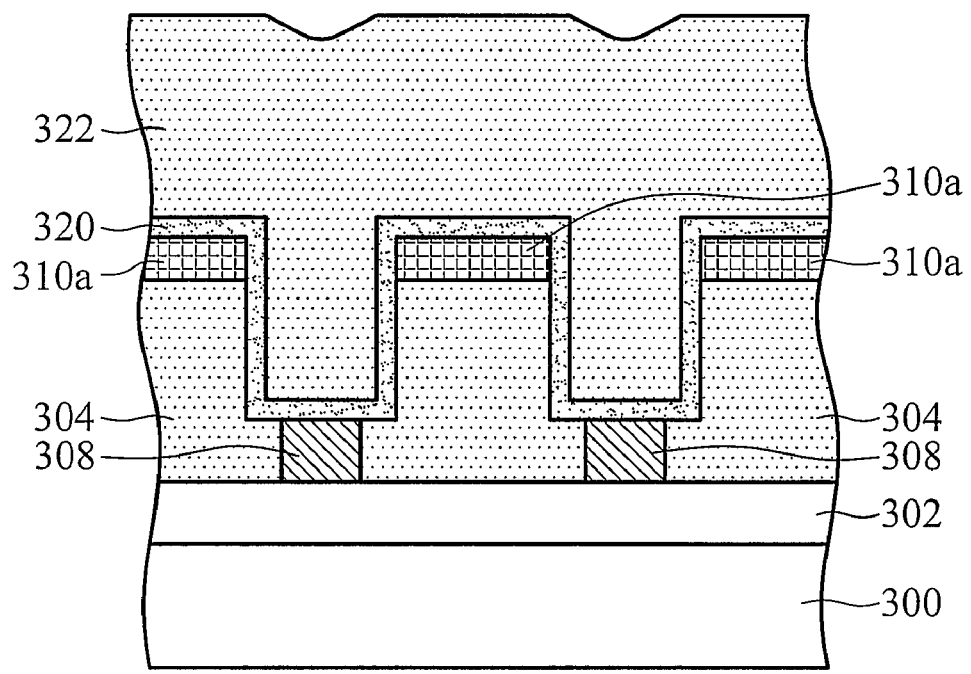

Referring to FIGS. 8a and 8b, a conductive layer 320 is formed on a sidewall of the cup-shaped opening 318 as shown in FIGS. 7a and 7b, and covering the switching element 308 by a method such as PVD, sputtering, CVD, ALD or electroless plating. An insulating layer 322 is then formed on the conductive layer 320 and filled into the cup-shaped opening 318 as shown in FIGS. 7a and 7b. The insulating layer 322 may comprise silicon oxide ($SiO_X$), silicon nitride ($SiN_Y$) or combinations thereof. The conductive layer 320 may comprise metals, alloys, metal compounds, semiconductor materials or combinations thereof. The conductive layer 320 may comprise basic metals or alloys thereof (such as Cu or Al), refractory metals or alloys thereof (such as Co, Ta, Ni, Ti, W or TiW), transition metal nitrides, refractory metal nitrides (such as CoN, TaN, NiN, TiN or WN), nitride metal silicides (such as $COSi_mN_n$, $TaSi_mN_n$, $NiSi_mN_n$, $TiSi_mN_n$ or $WSi_mN_n$), metal silicides (such as Co-salicide ($CoSi_z$), Ta-salicide ($TaSi_z$), Ni-salicide ($NiSi_z$), Ti-salicide ($TiSi_z$), W-salicide ($WSi_z$), polycrystalline semiconductor materials, amorphous semiconductor materials, phase change materials (such as GaSb, GeTe, $Ge_2Sb_2Te_5$ or Ag—In—Sb—Te), conductive oxide materials (such as yttrium barium copper oxide (YBCO), $Cu_2O$, indium tin oxide (ITO)) or combinations thereof. The conductive layer 320 may have a thickness of about 1 nm to 300 nm.

Figure 9A:
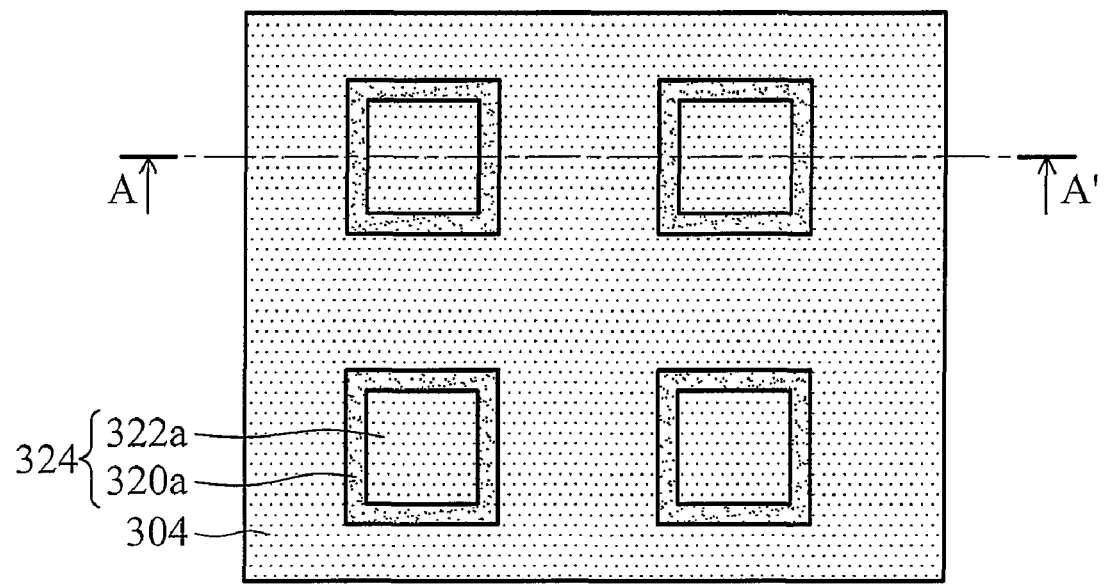
Figure 9B:
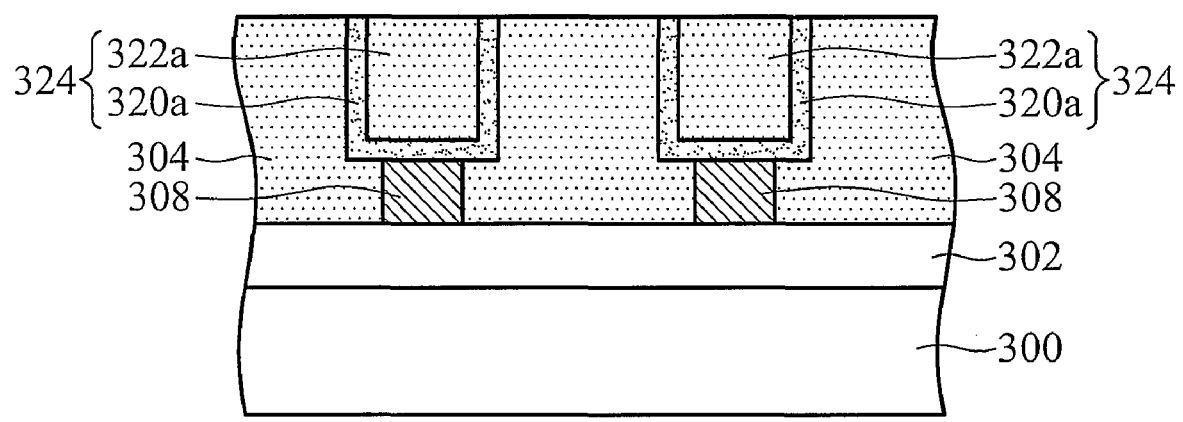

Referring to FIGS. 9a and 9b, a planarizing process such as chemical mechanical polishing (CMP) is performed to remove the excess conductive layer 320 and the insulating layer 322 to form a cup-shaped heating electrode 324. The cup-shaped heating electrode 324 comprises a conductive layer 320a and an insulating layer 322a. The cup-shaped heating electrode 324 is electrically connected to the electrode layer 302 through the switching element 308. In the first embodiment, the conductive layer 320a appears to have a square-ring shape from the top view as shown in FIG. 9a.

Figure 10A:
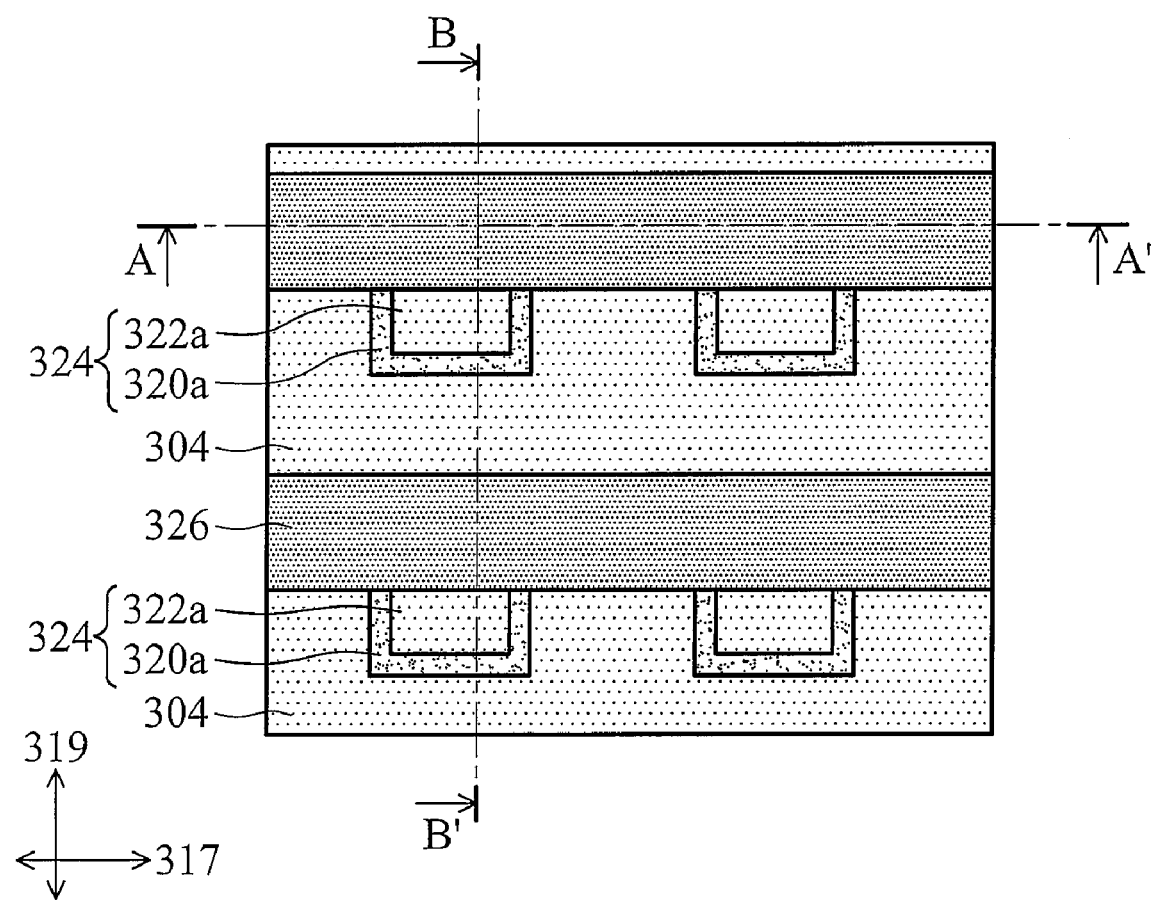
Figure 10B:
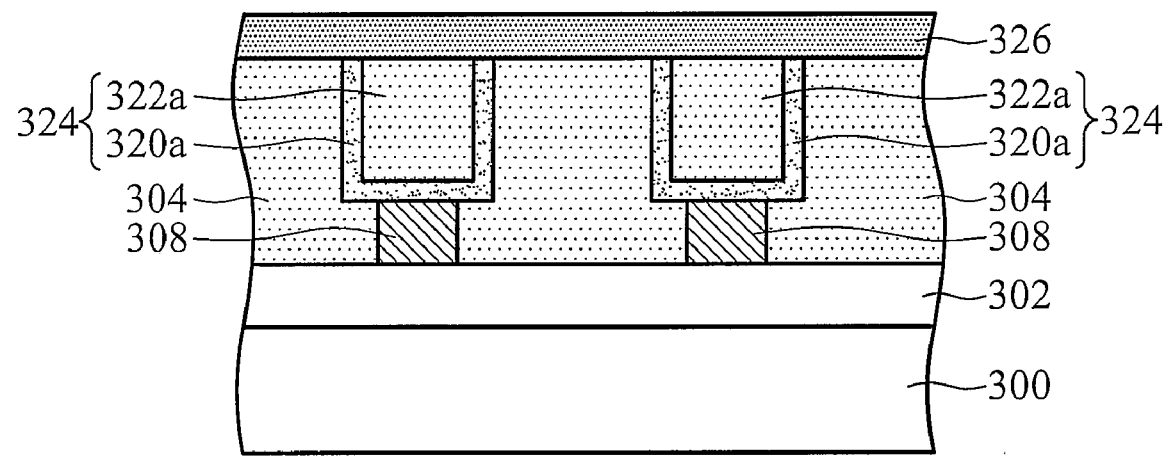
Figure 10C:
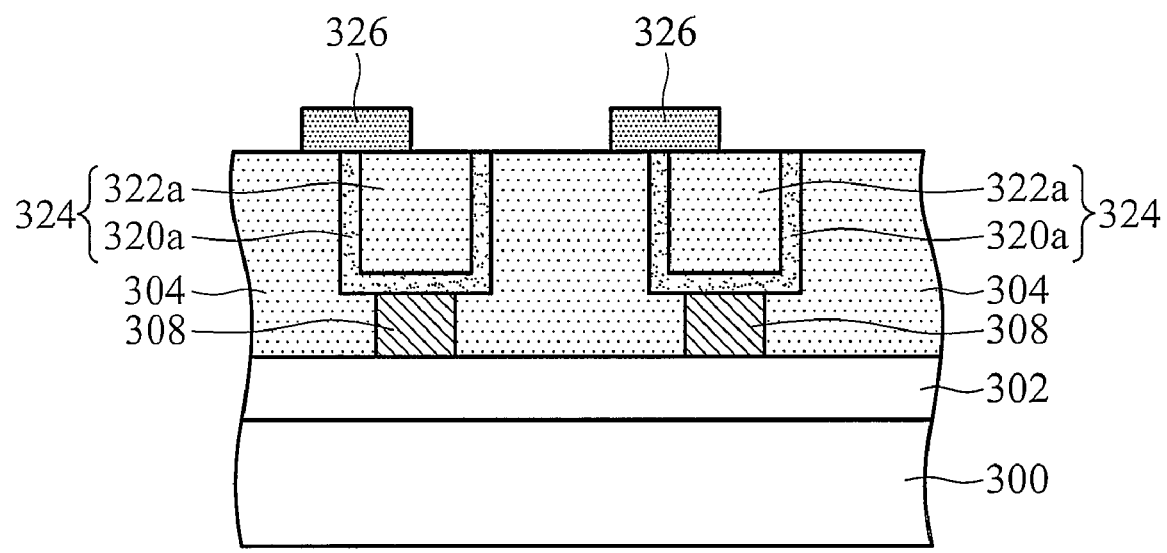
FIGS. 10c, 14c and 15c show cross sections taken along line B-B' of FIGS. 10a, 14a and 15a, respectively.

FIGS. 10a, 10b and 10c illustrate a formation of an insulating layer 326. An insulating layer such as silicon nitride ($SiN_Y$) or silicon oxide ($SiO_X$) is blanketly formed on the first dielectric layer 304 and the cup-shaped heating electrode 324. Next, a patterned photoresist (not shown) is used to cover the insulating layer and to define the position of the insulating layer 326. An anisotropic etching process is performed to remove the insulating layer not covered by the patterned photoresist. The patterned photoresist is then removed to form the insulating layer 326. In the first embodiment, the insulating layer 326 preferably has an etching selectivity of about 1 to 1000 with the dielectric layer 304. In another embodiment, a cleaning process may be performed using, for example, an inductively coupled plasma-Ar (ICP-Ar) to form the rounded insulating layer 326 (not shown) after forming the insulating layer 326. Although an isotropic etching such as dry or wet etching can be utilized to form the rounded insulating layer 326. The insulating layer 326 is formed on the first dielectric layer 304 along a first direction 317 and covers a portion of the cup-shaped heating electrode 324. Preferably, the insulating layer 326 with a thickness of about 60 nm covers one of two parallel edges of the cup-shaped heating electrode 324, for example, half of the cup-shaped heating electrode 324.

Figure 11A:
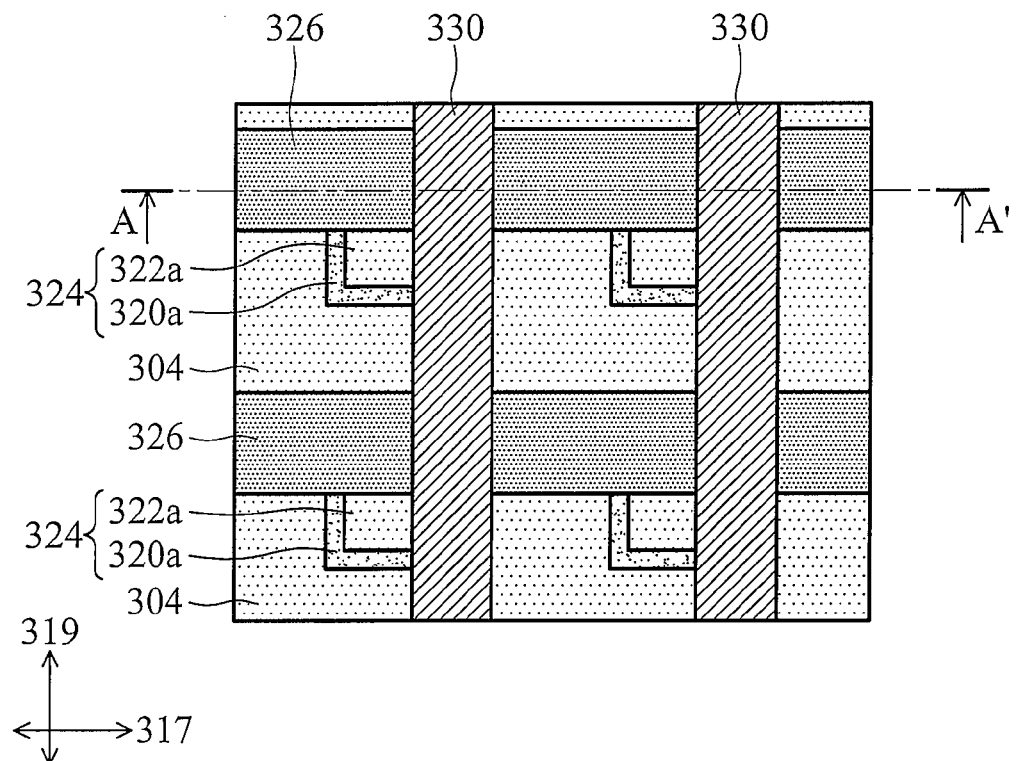
Figure 11B:
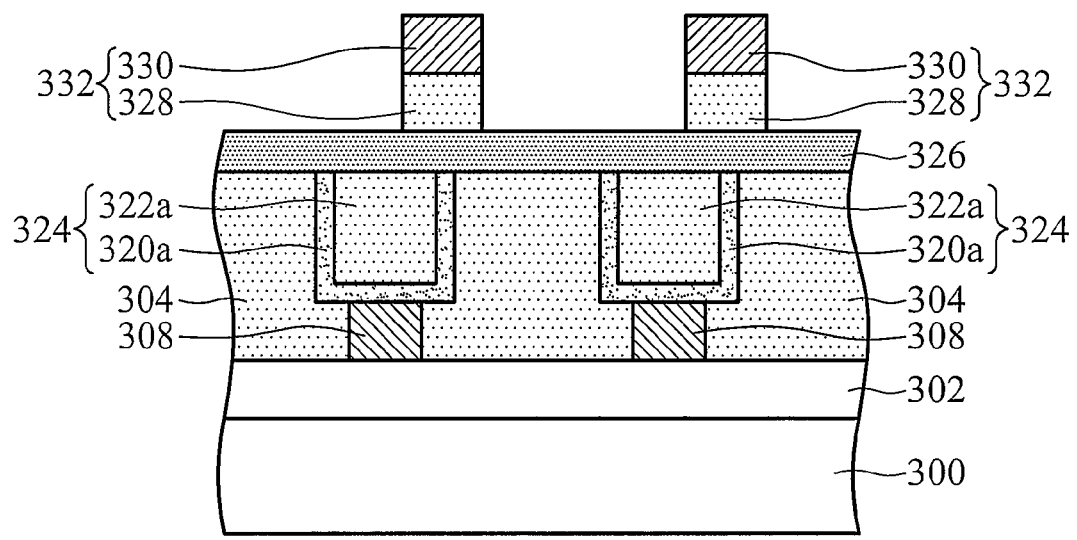

FIGS. 11a and 11b illustrate formation of a stacked structure 332. An insulating layer and a conductive layer are sequentially formed on the dielectric layer 304 and the insulating layer 326. The insulating layer may comprise silicon oxide ($SiO_X$), silicon nitride ($SiN_Y$) or combinations thereof. The conductive layer may comprise metals, alloys, metal compounds, semiconductor materials or combinations thereof. The conductive layer may comprise basic metals or alloys thereof (such as Cu or Al), refractory metals or alloys thereof (such as Co, Ta, Ni, Ti, W or TiW), transitional metal nitrides, refractory metal nitrides (such as CoN, TaN, NiN, TiN or WN), nitride metal silicides (such as $CoSi_mN_n$, $TaSi_mN_n$, $NiSi_mN_n$, $TiSi_mN_n$ or $WSi_mN_n$), metal silicides (such as Co-salicide ($CoSi_z$), Ta-salicide ($TaSi_z$), Ni-salicide ($NiSi_z$), Ti-salicide ($TiSi_z$), W-salicide ($WSi_z$), polycrystalline semiconductor materials, amorphous semiconductor materials, phase change materials (such as GaSb, GeTe, $Ge_2Sb_2Te_5$ or Ag—In—Sb—Te), conductive oxide materials (such as yttrium barium copper oxide (YBCO), $Cu_2O$, indium tin oxide (ITO)) or combinations thereof. The conductive layer may be a single layer or a composite layer formed by the aforementioned materials with an arbitrary sequence or layer number. Next, a patterned photoresist (not shown) is used to cover the conductive layer for defining the position of the stacked structure 332. An anisotropic etching process is performed to remove the conductive layer and the insulating layer not covered by the patterned photoresist. The patterned photoresist is then removed to form the stacked structure 332. The stacked structure 332 comprises an insulating layer 328 and a conductive layer 330 (serving as a top electrode layer 330) formed on the dielectric layer 304 along a second direction 319. The stacked structure 332 also covers a portion of the cup-shaped heating electrode 324 and the insulating layer 326. In one embodiment, the first direction 317 is substantially perpendicular to the second direction 319. Preferably, the stacked structure 332 covers one of two parallel edges along the second direction 319 of the cup-shaped heating electrode 324, for example, one quarter of the cup-shaped heating electrode 324. The insulating layer 328 and the conductive layer 322 preferably have a thickness of about 100 nm respectively.

Figure 12A:
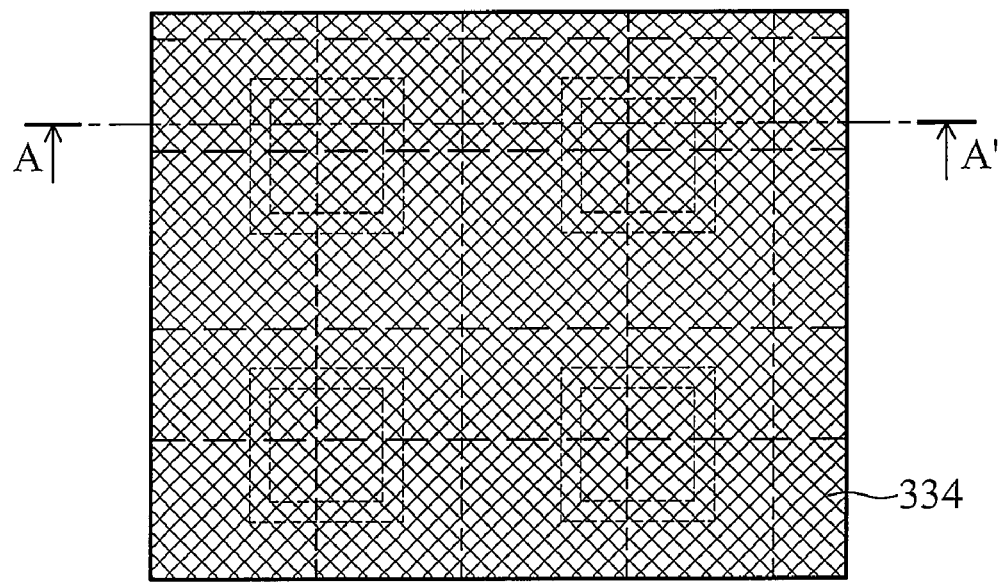
Figure 12B:
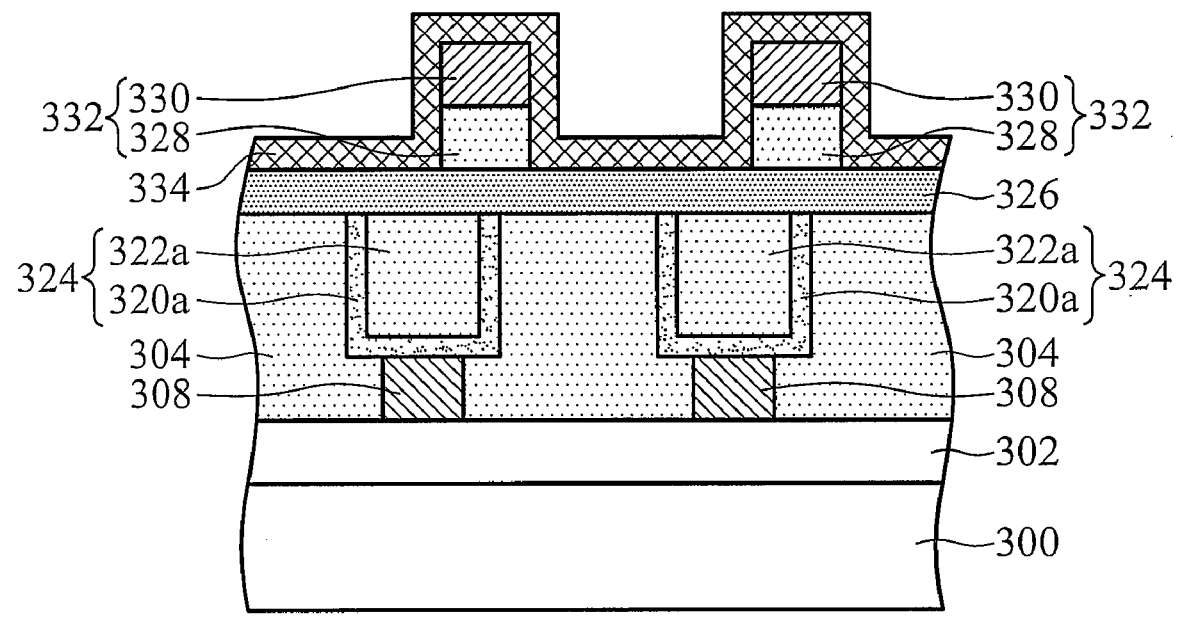

FIGS. 12a and 12b illustrate an embodiment of forming a phase change material layer 334. The phase change material layer 334 is blanketly deposited over the entire region by physical vapor deposition (PVD), thermal evaporation, pulsed laser deposition or metal organic chemical vapor deposition (MOCVD). The phase change material 326 may comprise binary, ternary or tetra chalcogenide such as GaSb, GeTe, Ge—Sb—Te (GST) alloy, Ag—In—Sb—Te alloy or combination thereof. In the first embodiment, the phase change material layer 334 preferably has a thickness of about 10 nm to 50 nm. The thickness of the phase change material layer 334 may be up to 100 nm if the cup-shaped opening 318 has a larger aperture as shown in FIGS. 7a and 7b to meet phase change memory device requirements.

Figure 13A:
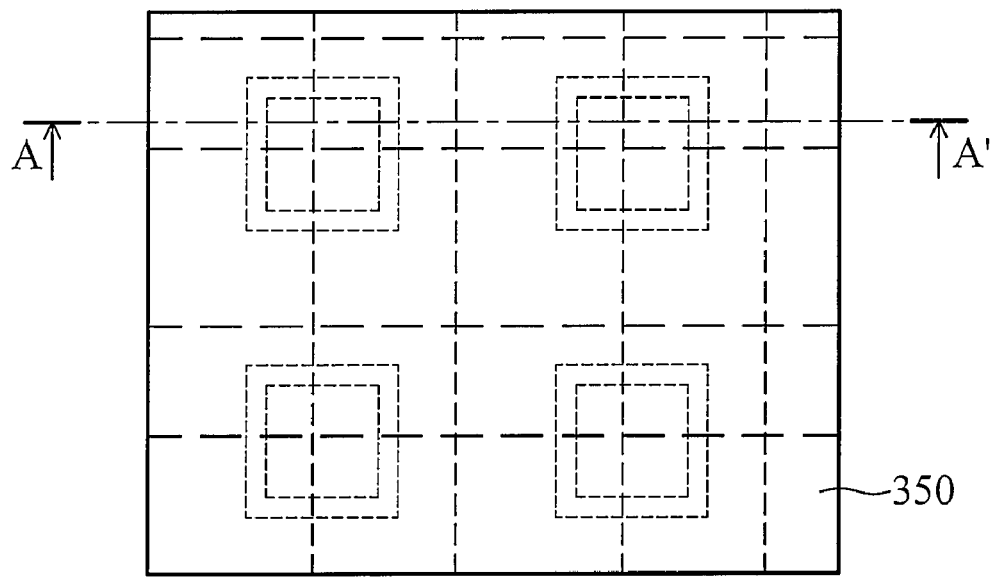
Figure 13B:
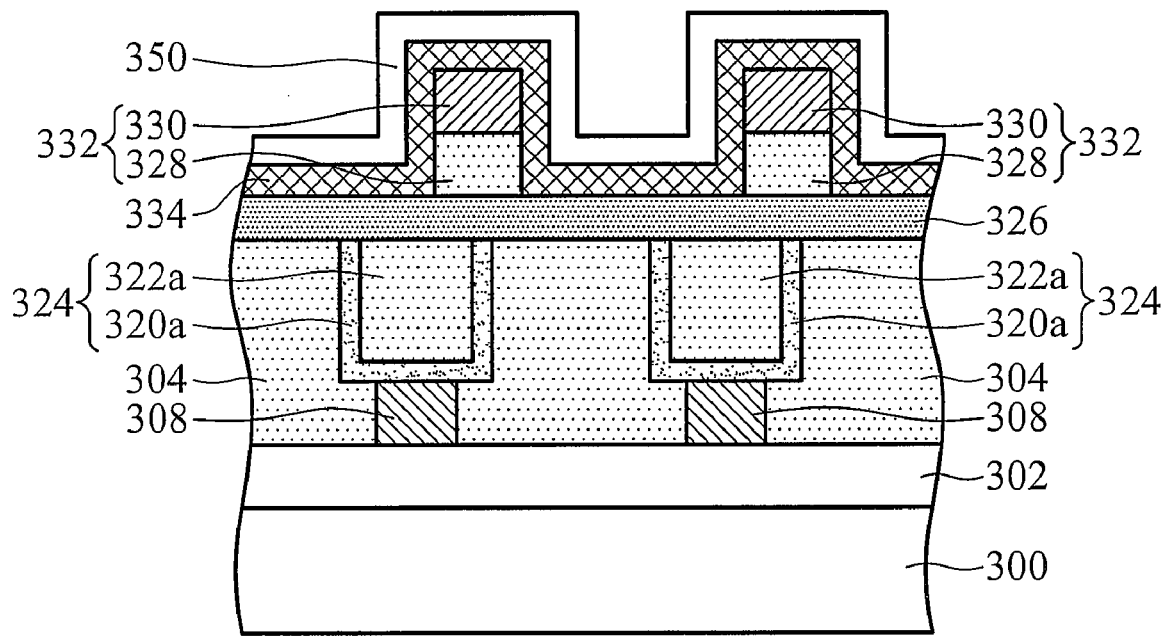

Referring to FIGS. 13a and 13b, an insulating material layer 350 is formed covering the phase change material layer 334 by plasma enhanced chemical vapor deposition (PECVD). The insulating material layer 350 may comprise oxide or nitride with a preferable thickness of about 10 nm to 50 nm.

Figure 14A:
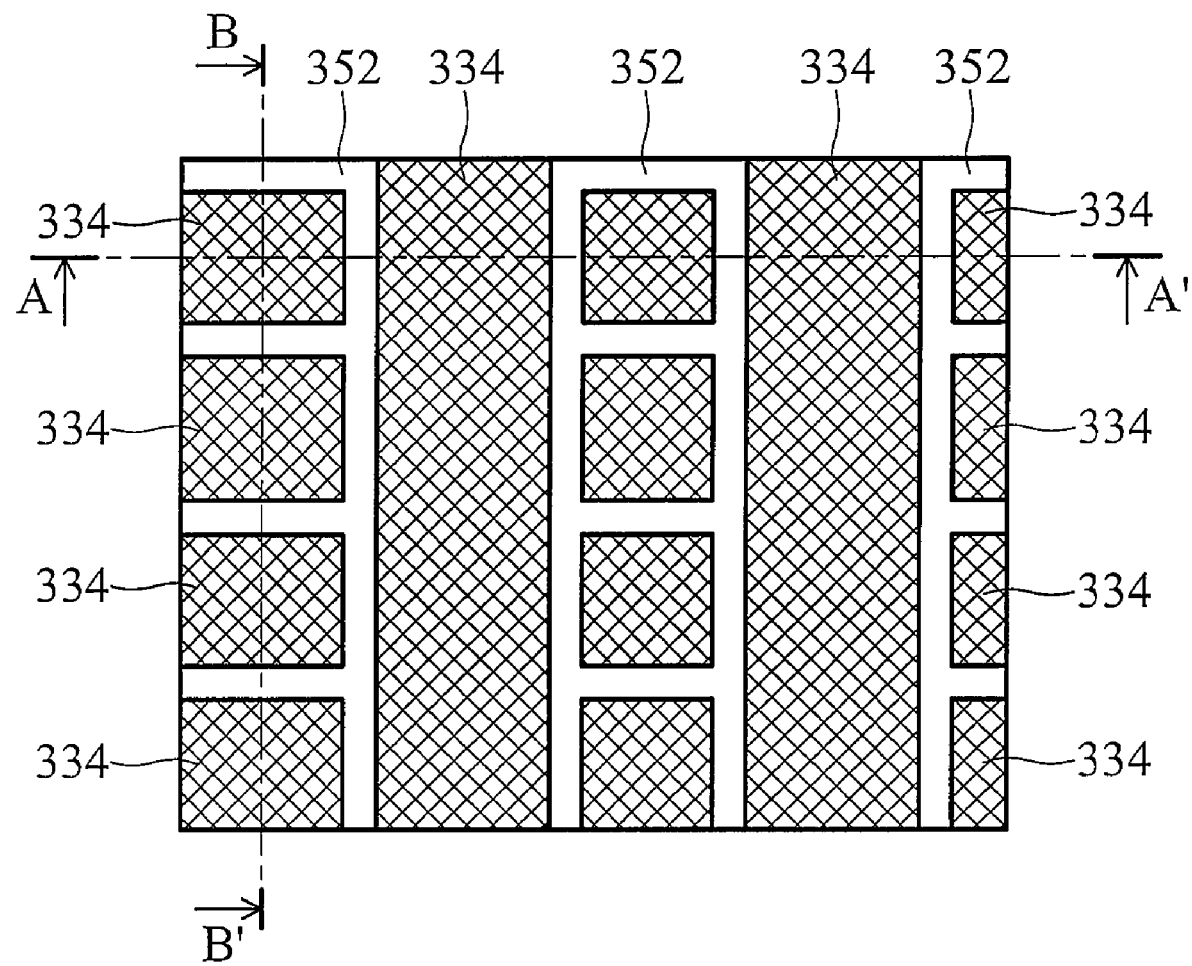
Figure 14B:
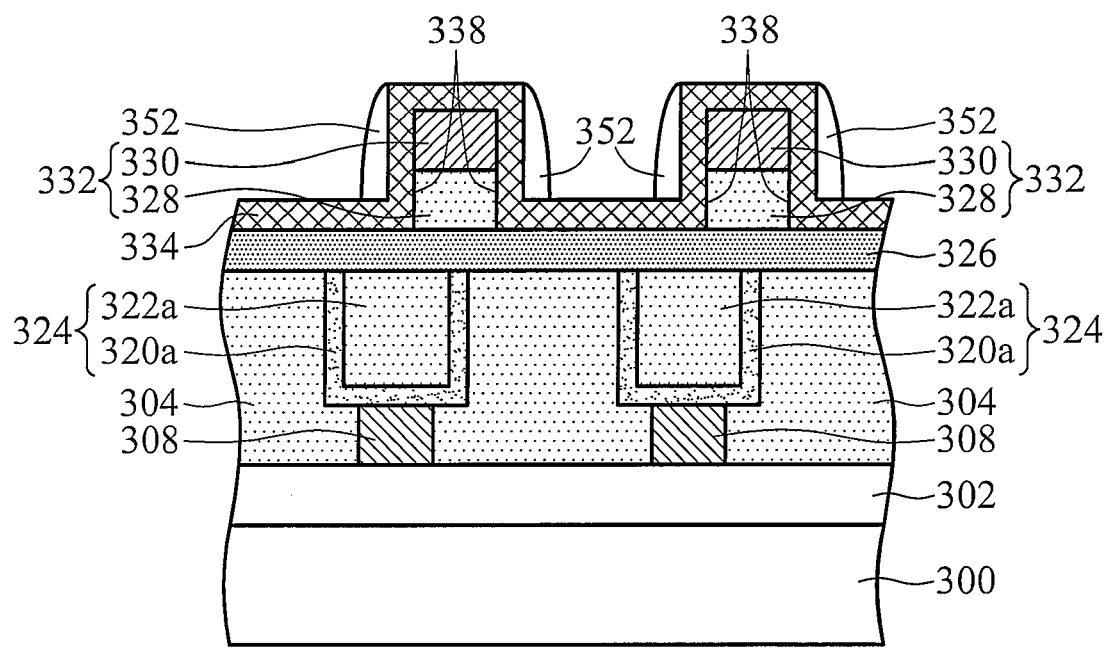
Figure 14C:
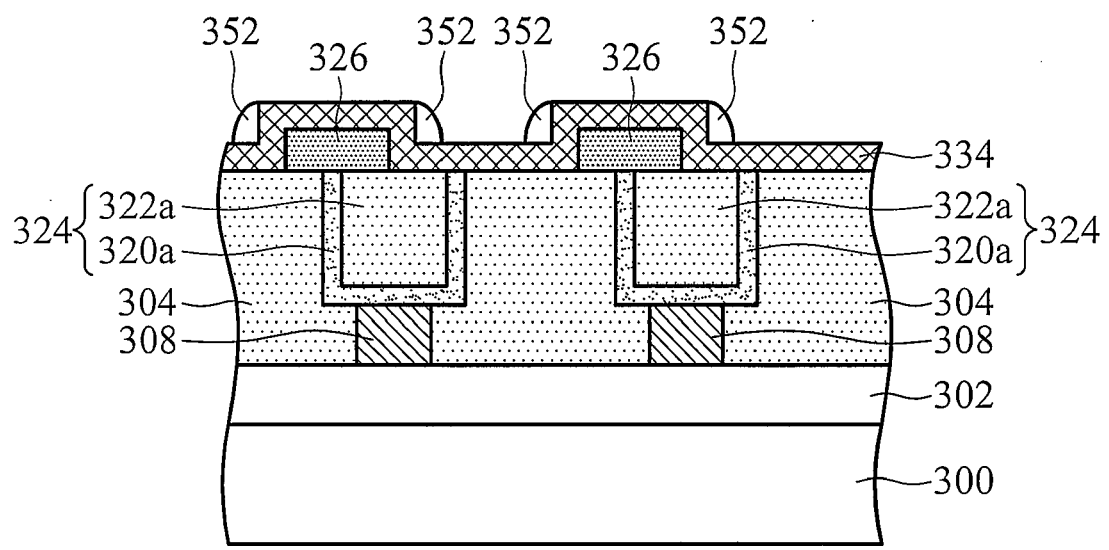
Figure 15A:
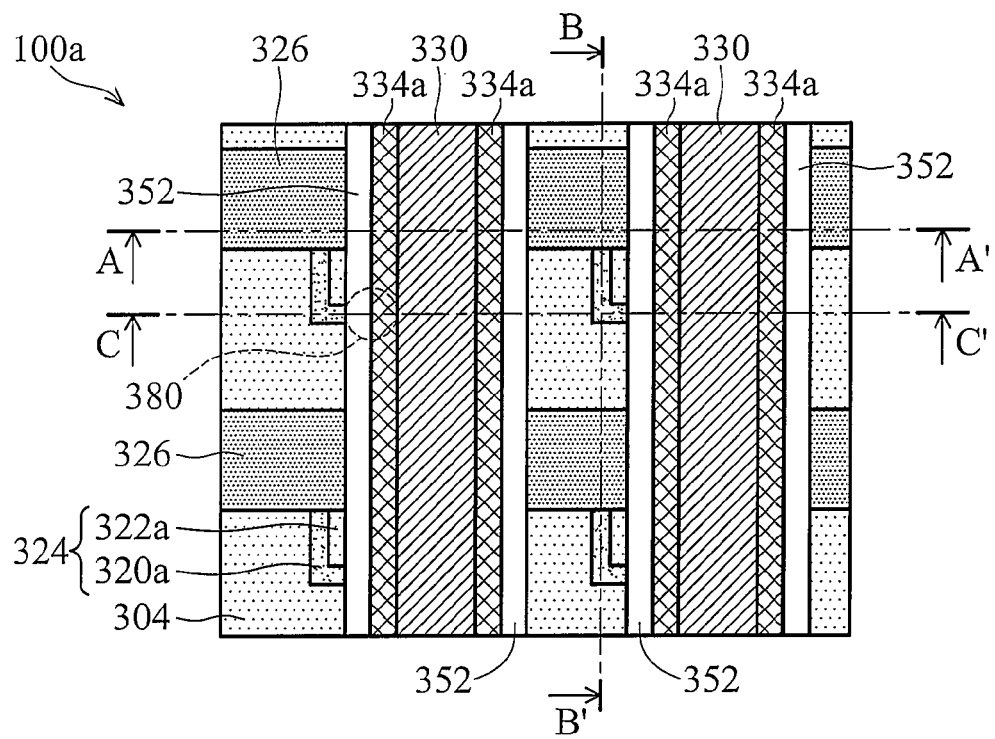
Figure 15B:
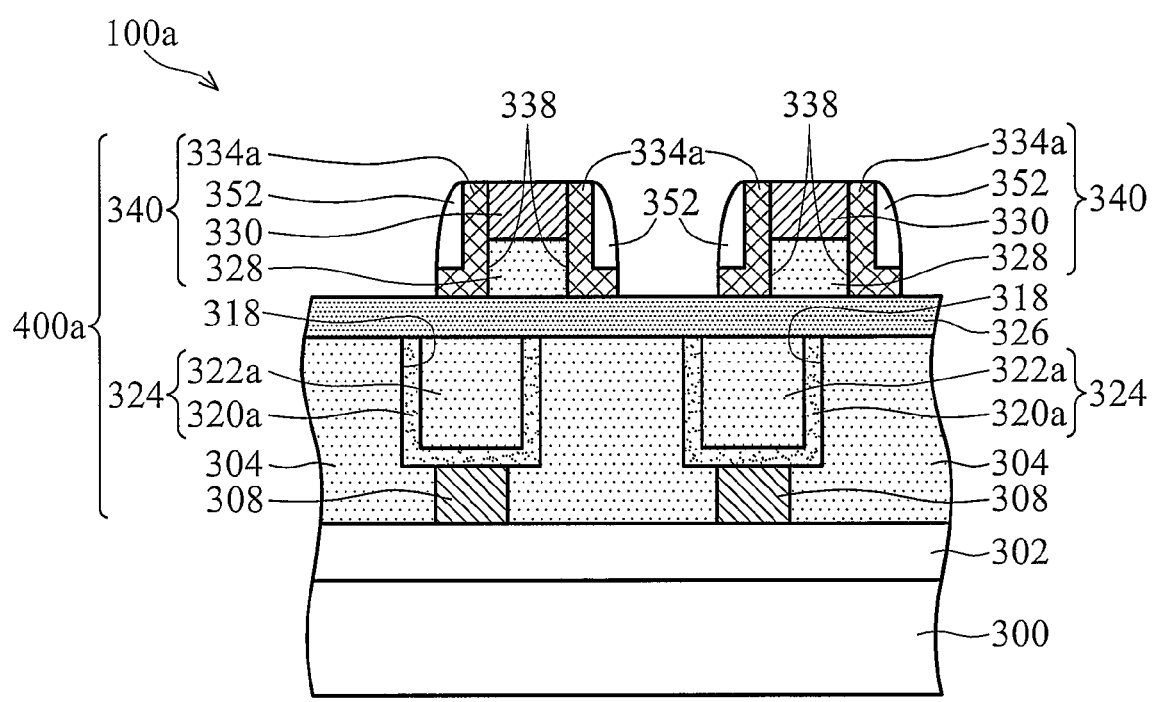
Figure 15C:
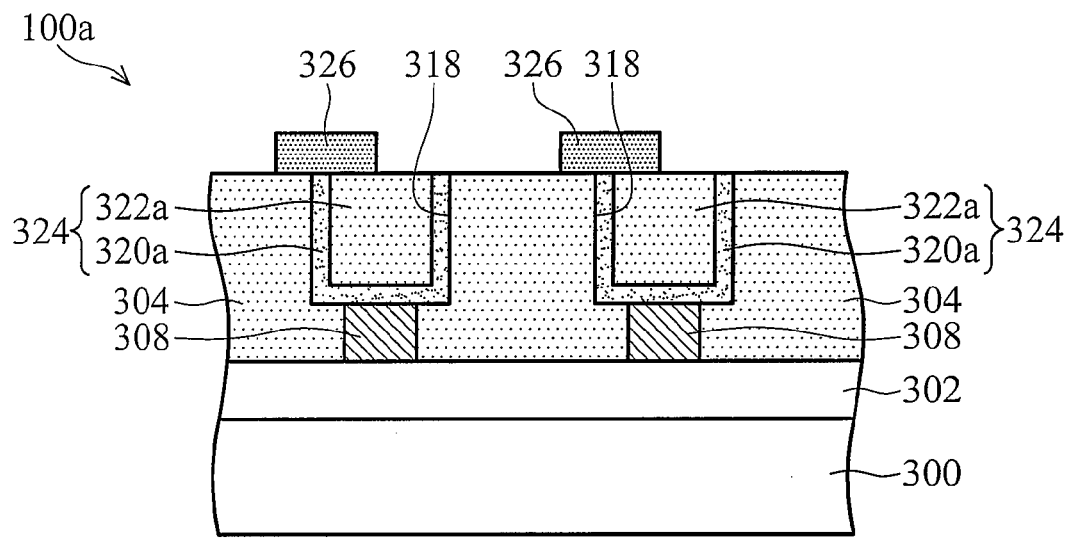
Figure 15D:
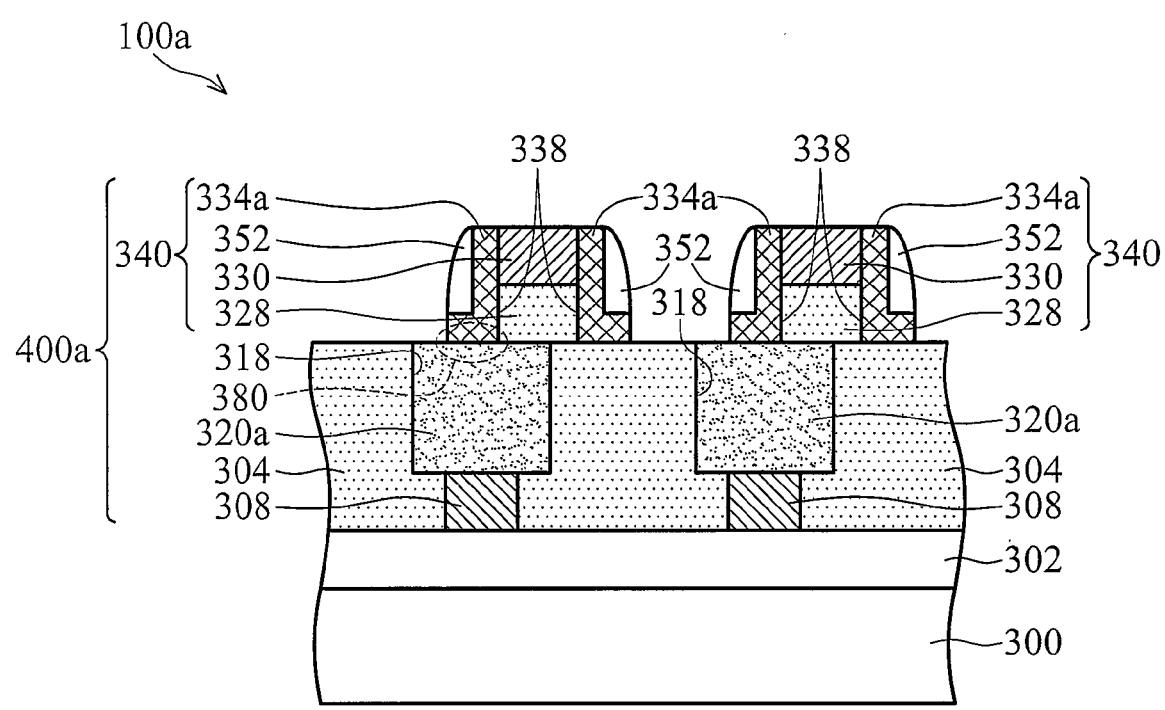

Referring to FIGS. 14a, 14b and 14c, an anisotropic etching is performed to remove a portion of the insulating material layer 350. Insulating material spacers 352 are thus formed above sidewalls 338 of the stacked structures 332. The phase change material layer 334 preferably has an etching selectivity of about 1 to 1000 with the insulating material layer 350.

In another embodiment, the insulating material layer 350 on the rounded insulating layer 326 (not shown) is completely removed after the anisotropic etching process.

Referring to FIGS. 15a, 15b, 15c and 15d, an anisotropic etching is performed to remove a portion of the insulating material spacers 352 formed on sidewalls of the insulating layer 326, the phase change material layer 334 not covered by the insulating material spacers 352 or formed on sidewalls of the insulating layer 326 to form phase change material spacers 334a. An electrode structure 340 comprising a double spacers comprising the insulating material spacers 352 and the phase change material spacers 334a is thus formed. In another embodiment, the phase change material layer 334 formed on the rounded insulating layer 326 (not shown) is completely removed after the anisotropic etching process. The electrode structure 340 comprises the insulating layer 328, the conductive layer 322, the insulating material spacers 352 and the phase change material spacers 334a. A phase change memory structure 400a is thus completely formed. After the fabrication processes, the first embodiment of a phase change memory device 100a is thus completely formed. An intersecting area of the phase change material spacer 334a and the conductive layer 320a controls a contact area 380a between the phase change material spacer 334a and the cup-shaped heating electrode 324. Compared to the conventional process, the size of the contact area 380 is smaller and more precisely controlled.

The insulating material spacer 352 covers the phase change material spacer 334a of the electrode structure 340 of phase change memory device 100a. The insulating material spacer 352 covering protects phase change material spacer 334a from damage due to etching of the phase change material layer 334. Conventional phase material spacers suffer from surface damage due to metal-based polymer residue remaining on edges of the phase material layer or from the etching gas attack during the phase material layer etching process. Conventional phase change memory performance is thus affected even if phase change does not occur. In the phase change memory device 100a, the metal-based polymer residue or the etching gas attacked region can be separated from the contact area 380 between the phase change material spacer 334a and the cup-shaped heating electrode 324 by the insulating material spacer 352. Thus phase change memory device performance and product yield can be improved.

Alternatively, a dielectric layer is blanketly deposited covering the phase change memory structure 400a. A planarizing process such as chemical mechanical polishing (CMP) is then performed to remove the excess dielectric layer until the conductive layer 330 of the electrode structure 340 is exposed. Next, several phase change memory structures 400a are perpendicularly stacked and electrically connected to each other forming a 3-dimensional (3D) memory array by repeating the processes as shown in FIGS. 2a, 2b to 15a~15d. The number of the phase change memory devices 400a is not limited.

The first embodiment of phase change memory device 100a mainly comprises: a substrate 300; an electrode layer 302 formed on the substrate 300; a phase change memory structure 400a formed on the electrode layer 302 and electrically connected to the electrode layer 302, wherein the phase change memory structure 400a comprises a cup-shaped heating electrode 324 placed on the electrode layer 302; an insulating layer 326 placed on the cup-shaped heating electrode 324 along a first direction 317 covering a portion of the cup-shaped heating electrode 324; an electrode structure 340 placed on the cup-shaped heating electrode 324 along a second direction 319 covering a portion of the insulating layer 326 and the cup-shaped heating electrode 324; a pair of double spacers placed on a pair of sidewalls 338 of the electrode structure 340 covering a portion of the cup-shaped heating electrode 324, wherein the double spacer comprises a phase change material spacer 334a and an insulating material spacer 352 placed on a sidewall of the phase change material spacer 334a.

Some advantages of the 3D phase change memory device 100a are described in the following. In the cup-shaped opening fabrication process, the aperture or spacing of the cup-shaped opening can be shrunk to the limits of photolithography resolution. The phase change memory device 100a comprises double spacers with a phase change material spacer covered by an insulating material spacer. The insulating material spacer covering protects the phase change material spacer from damage during formation thereof by etching the phase change material. At the same time, the metal-based polymer residue or the surface damage region can be separated from the contact area between the phase change material spacer and the cup-shaped heating electrode by the insulating material spacer. Thus, phase change memory device performance process and yield may be improved. The phase change memory device is multi-bit memory cell unit, referred to as a multi-level cell (MLC). Lastly, by controlling the contact area via an intersecting area between the phase change material spacer and the cup-shaped heating electrode minimizes contact area.

Second Embodiment

Figure 16A:
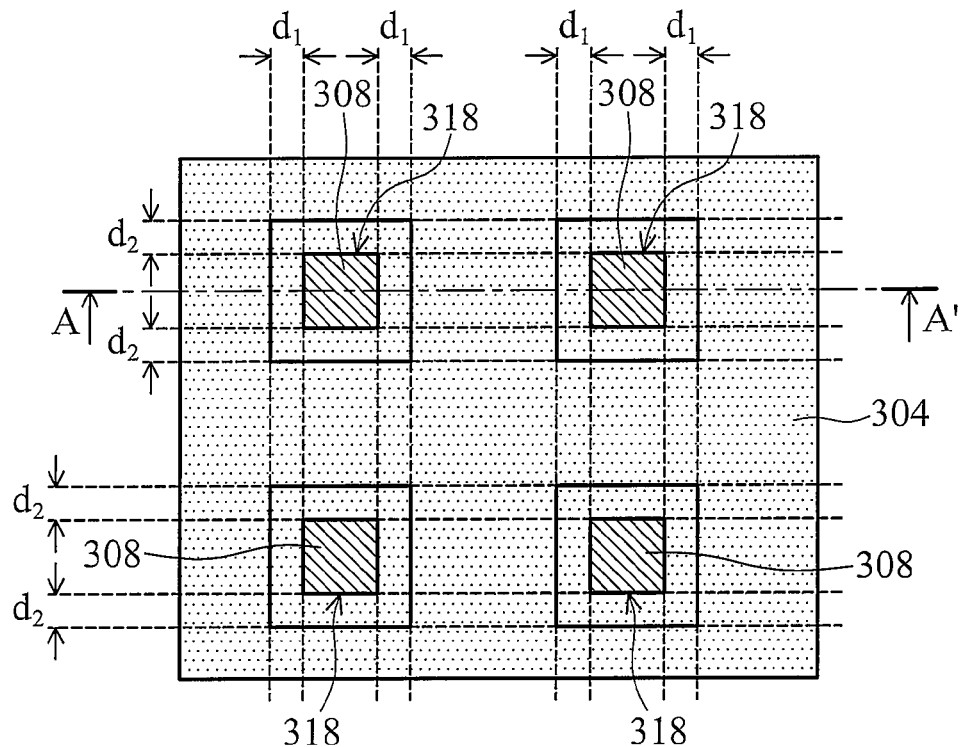
FIGS. 16a, 17a, 18a, 19a, 20a, 21a, 22a, 23a, 24a, 25a, 26a and 27a show top views of a second embodiment of a phase change memory device.
Figure 16B:
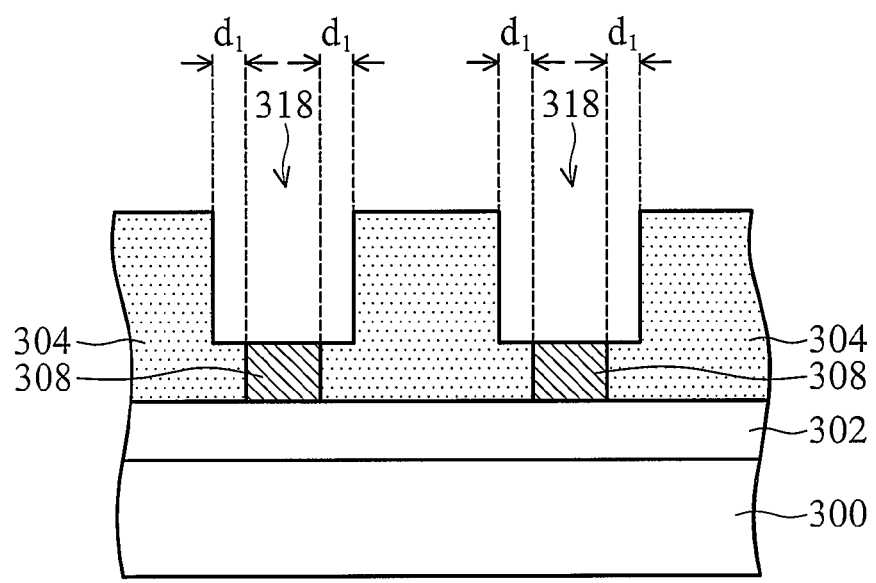
FIGS. 16b, 17b, 18b, 19b, 20b, 21b, 22b, 23b, 24b, 25b, 26b and 27b show cross sections taken along line A-A' of FIGS. 16a, 17a, 18a, 19a, 20a, 21a, 22a, 23a, 24a, 25a, 26a and 27a, respectively.

FIGS. 16a and 16b illustrate the second embodiment of a cup-shaped opening 318. Fabrication processes of this embodiment are the same as those previously described with reference FIGS. 2a and 2b to 6a and 6b, thus descriptions thereof are not repeated for brevity. An anisotropic etching process is performed to remove a portion of the dielectric layer 304 until the switching element 308 is exposed using the hard masking layers 310a and the photoresist layers 316 as masks as shown in FIGS. 6a and 6b. Next, the photoresist layer 316 is removed to form a cup-shaped opening 318 with a bottom aligned to top of the switching element 308 using a photoresist asher or a photoresist stripping (PR stripping) process. In this embodiment, the hard masking layers 310a preferably have an etching selectivity greater than 5 with the dielectric layer 304. The cup-shaped opening 318 is square from the top view as shown in FIG. 16a. Aperture of the cup-shaped opening 318 or spacing therebetween are related to critical dimensions of the hard masking layers 310a or the photoresist layers 316. The formation of the cup-shaped opening 318 can prevent the corner rounding phenomenon when defining the cup-shaped opening 318 with only one mask. In the second embodiment, the aperture of the cup-shaped opening 318 is of about 10 nm to 500 nm, preferably of about 480 nm.

Figure 17A:
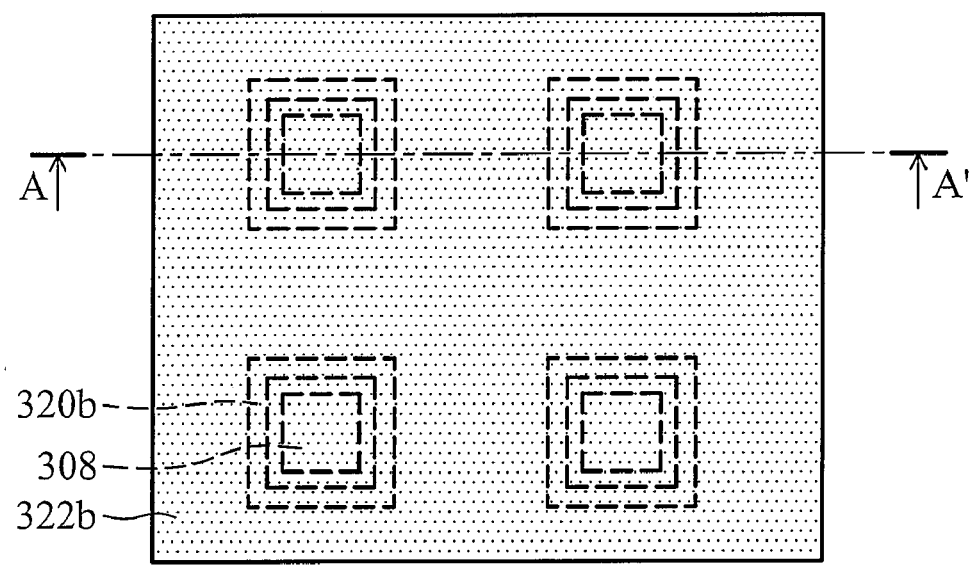
Figure 17B:
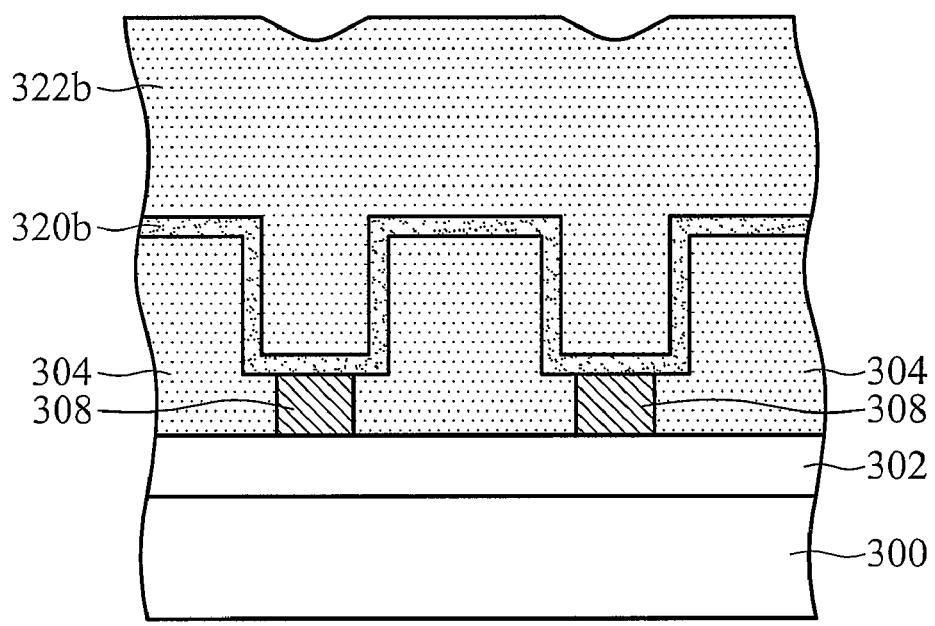

Referring to FIGS. 17a and 17b, a conductive layer 320b is formed on a sidewall of the cup-shaped opening 318 as shown in FIGS. 16a and 16b, and covering the switching element 308 by a method such as PVD, sputtering, CVD, ALD or electroless plating. An insulating layer 322b is then formed on the conductive layer 320b and filled into the cup-shaped opening 318 as shown in FIGS. 16a and 16b. The insulating layer 322b may comprise silicon oxide ($SiO_x$), silicon nitride ($SiN_y$) or combinations thereof. The conductive layer 320b may comprise metals, alloys, metal compounds, semiconductor materials or combinations thereof. The conductive layer 320b may comprise basic metals or alloys thereof (such as Cu or Al), refractory metals or alloys thereof (such as Co, Ta, Ni, Ti, W or TiW), transition metal nitrides, refractory metal nitrides (such as CoN, TaN, NiN, TiN or WN), nitride metal silicides (such as $CoSi_mN_n$, $TaSi_mN_n$, $NiSi_mN_n$, $TiSi_mN_n$ or $WSi_mN_n$), metal silicides (such as Co-salicide ($CoSi_z$), Ta-salicide ($TaSi_z$), Ni-salicide ($NiSi_z$), Ti-salicide ($TiSi_z$), W-salicide ($WSi_z$), polycrystalline semiconductor materials, amorphous semiconductor materials, phase change materials (such as GaSb, GeTe, $Ge_2Sb_2Te_5$ or Ag—In—Sb—Te), conductive oxide materials (such as yttrium barium copper oxide (YBCO), $Cu_2O$, indium tin oxide (ITO)) or combinations thereof. The conductive layer 320b may have a thickness of about 1 nm to 300 nm.

Figure 18A:
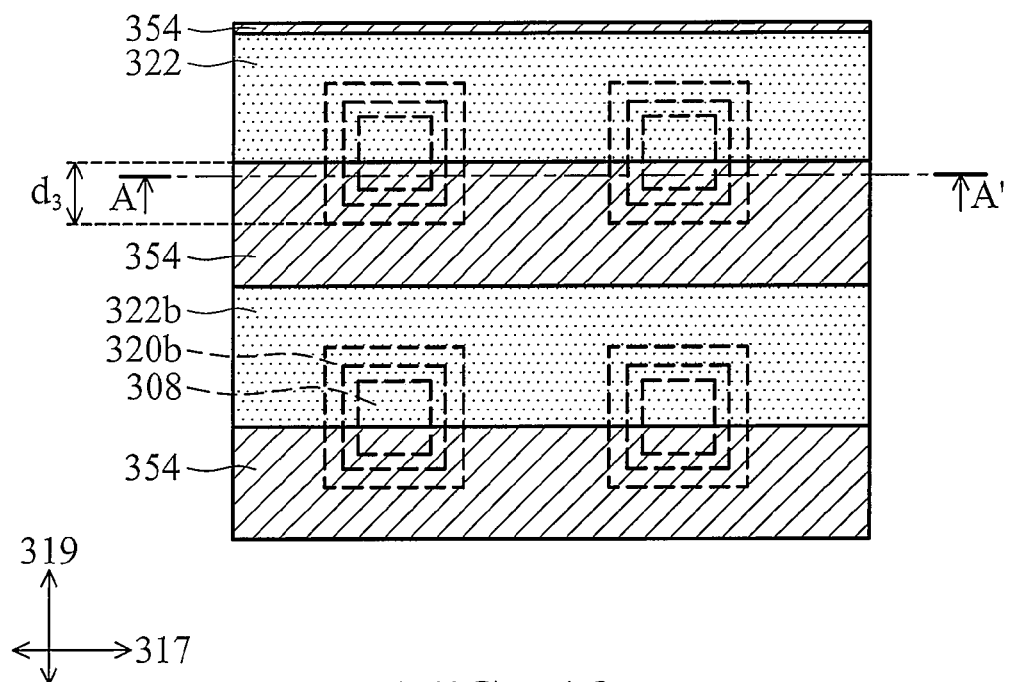
Figure 18B:
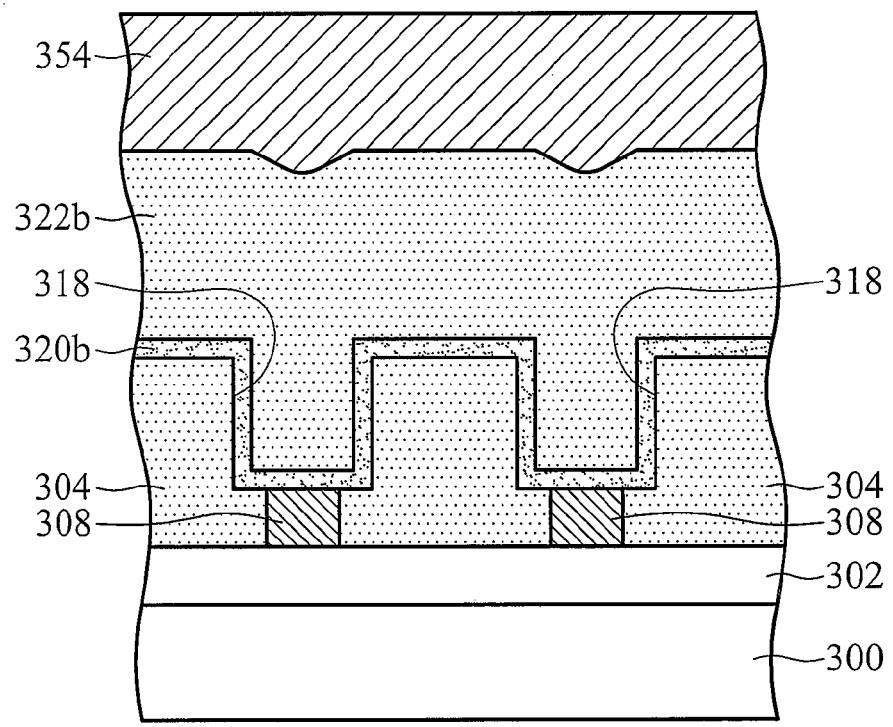

Referring to FIGS. 18a and 18b, a photoresist layer (not shown) is formed on the insulating layer 322b. A photolithography process is then performed to form a photoresist layer 354 using the same mask used to form the photoresist layer 316 with an offset a third distance $d_3$ along a second direction 319. In the second embodiment, the third distance $d_3$ is of about 120 nm to 200 nm, preferably about 140 nm. The photoresist layer 354 only covers a portion of the cup-shaped opening 318, preferably, half the cup-shaped opening 318.

Figure 19A:
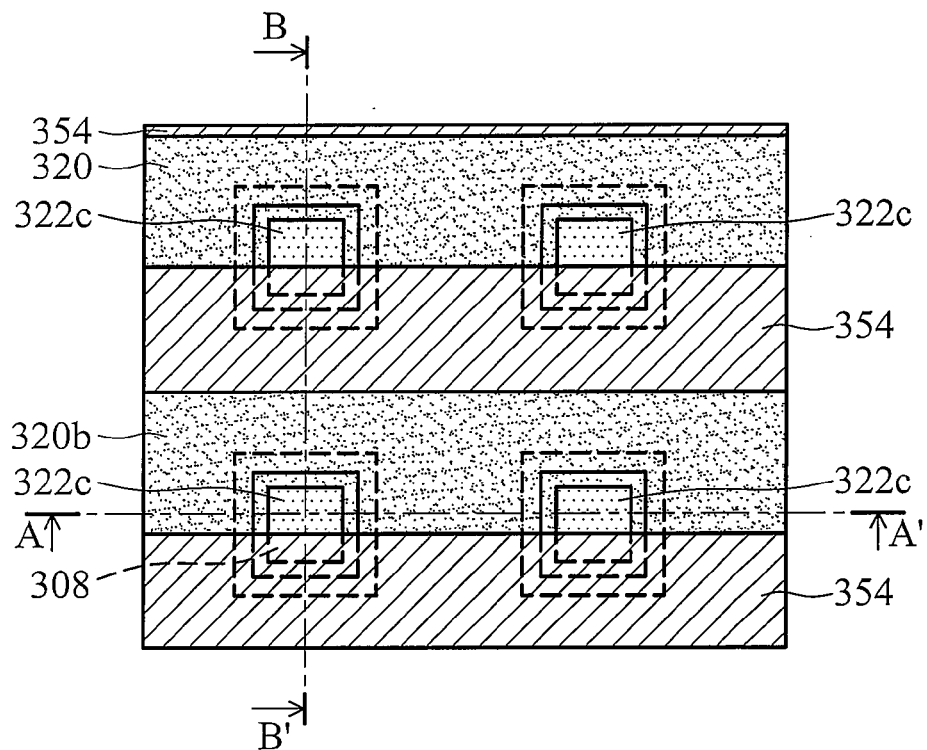
Figure 19B:
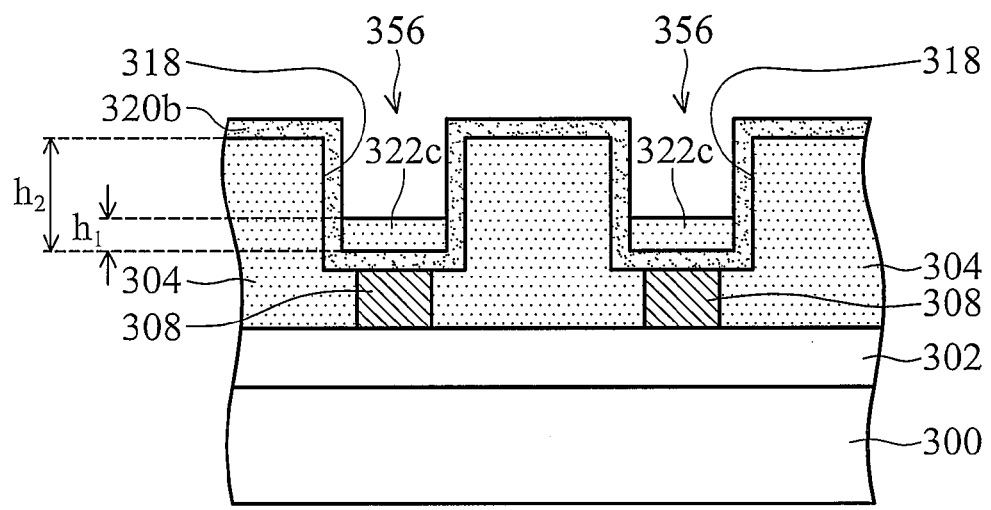
Figure 19C:
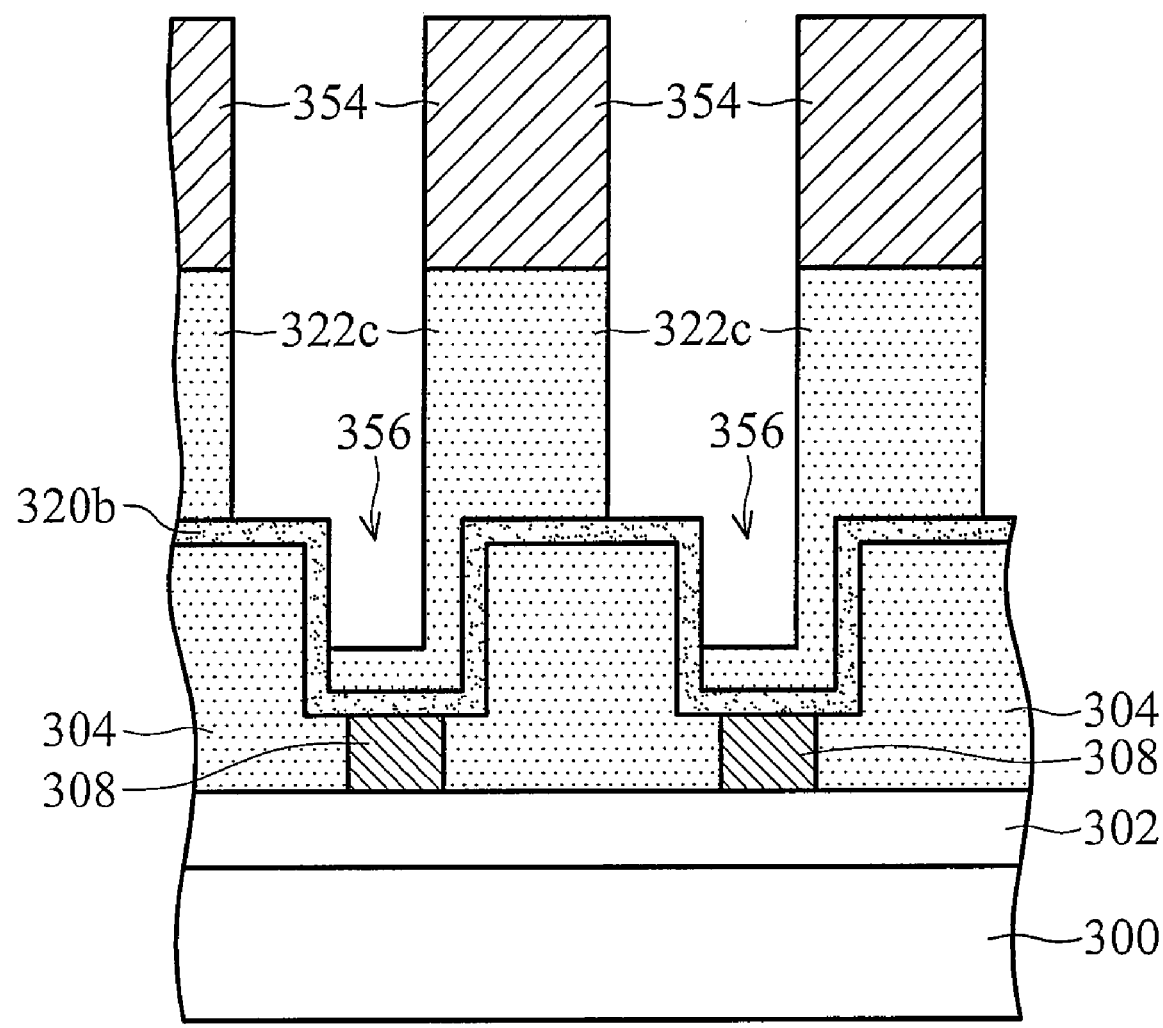
FIGS. 19c, 20c, 21c, 22c, 23c and 27c show cross sections taken along line B-B' of FIGS. 19a, 20a, 21a, 22a, 23a and 27a, respectively.

Referring to FIGS. 19a, 19b and 19c, a portion of the insulating layer 322b is removed to form an insulating layer 322c and an opening 356 using anisotropic etching such as dry etching. The insulating layer 322c in the opening 356 preferably has a height $h_1$ lower than the conductive layer 320b. In the second embodiment, the height $h_1$ of the insulating layer 322c is preferably one quarter of a height difference $h_2$ between the insulating layer 322c and the dielectric layer 304.

Figure 20A:
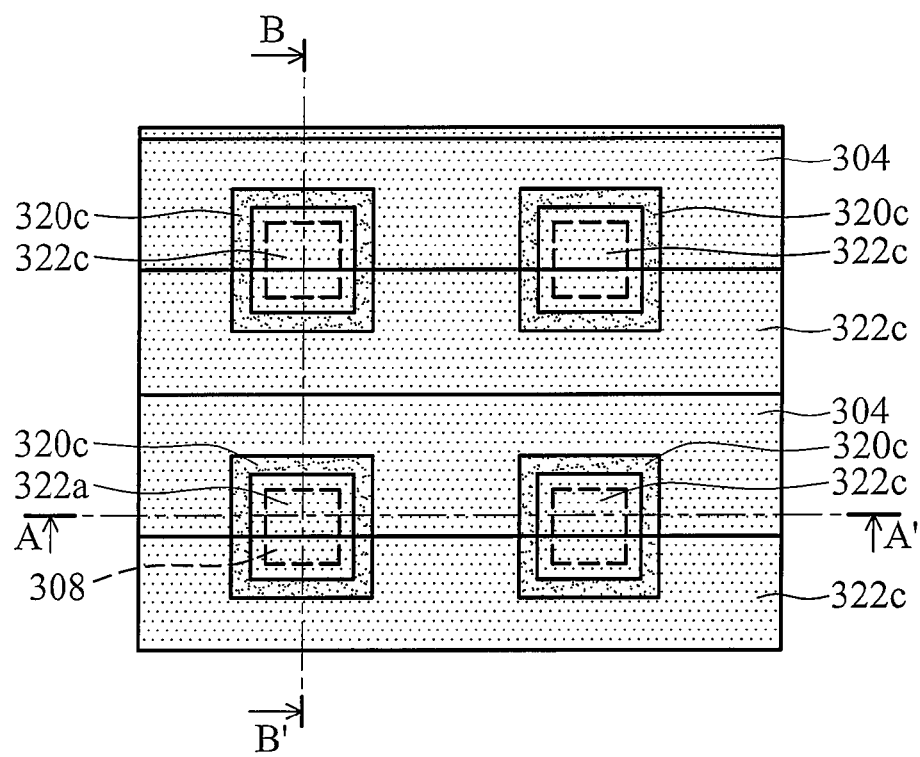
Figure 20B:
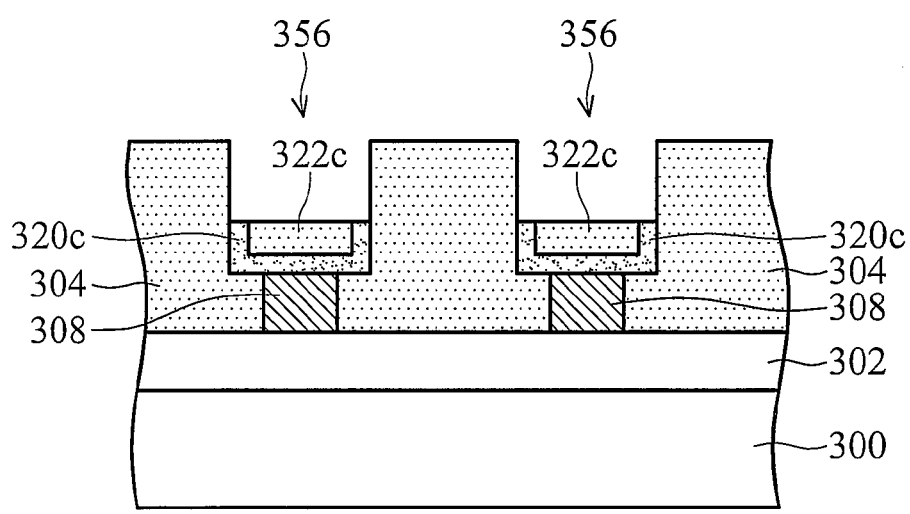
Figure 20C:
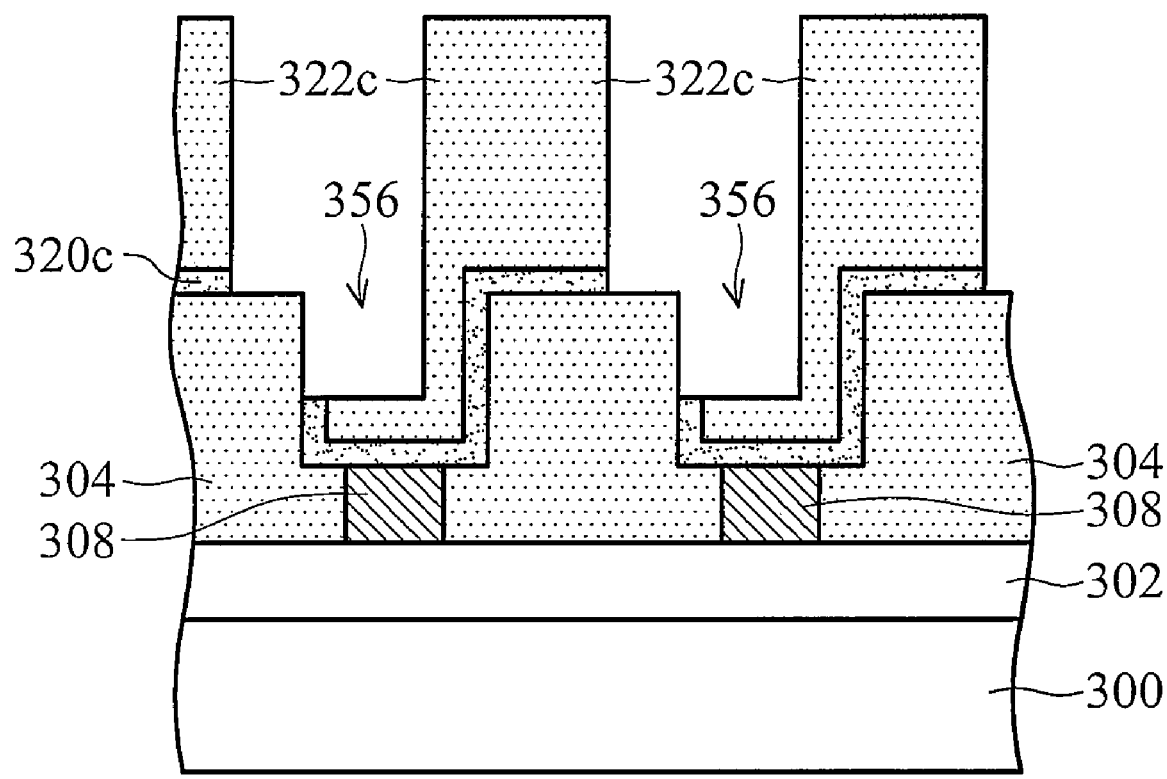

As shown in FIGS. 20a, 20b and 20c, the conductive layer 320b not covered by photoresist layer 354 is removed to form a conductive layer 320c covering a portion of the sidewall of the cup-shaped opening 318 as shown in FIGS. 16a and 16b. Next, the photoresist layer 354 is removed using a photoresist asher or a photoresist stripping (PR stripping) process. The conductive layer 320c in the opening 356 is substantially coplanar with the insulating layer 322c as shown in FIG. 20b. The conductive layer 320c is partially removed as shown in FIG. 20c.

Figure 21A:
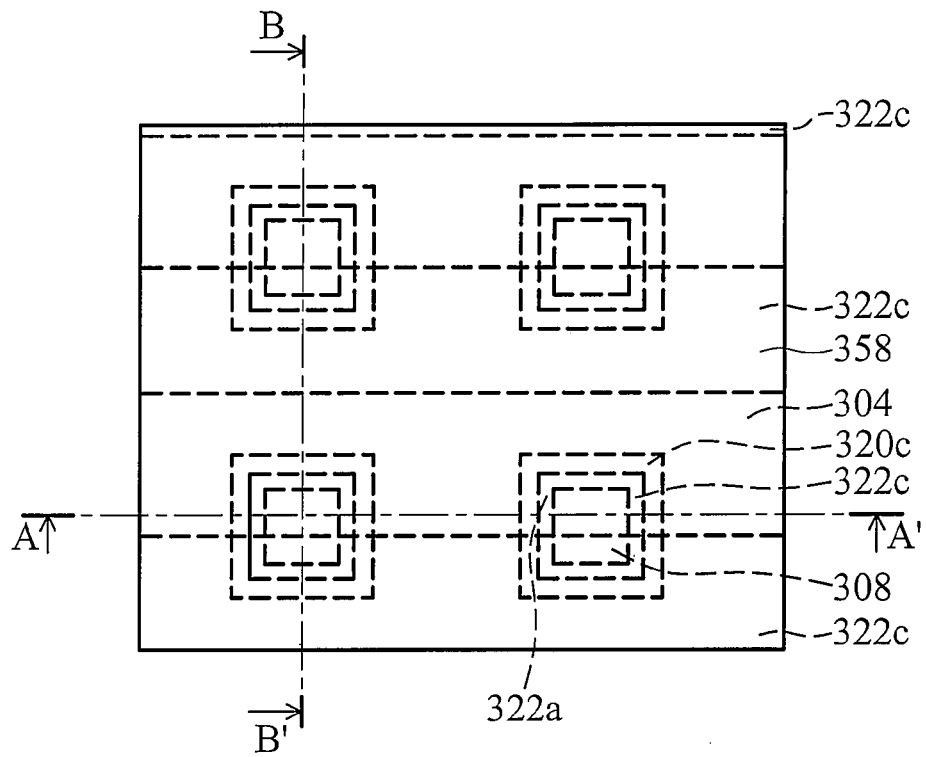
Figure 21B:
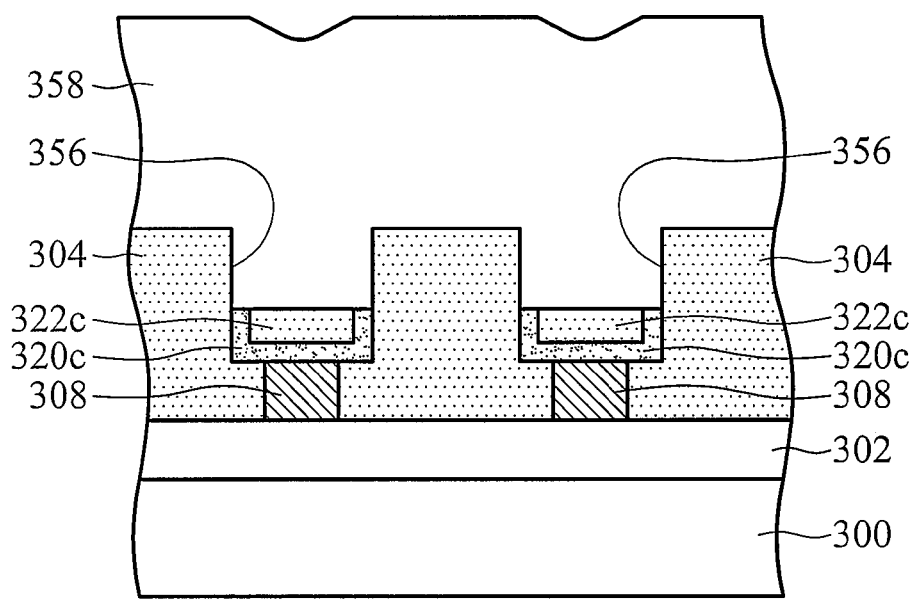
Figure 21C:
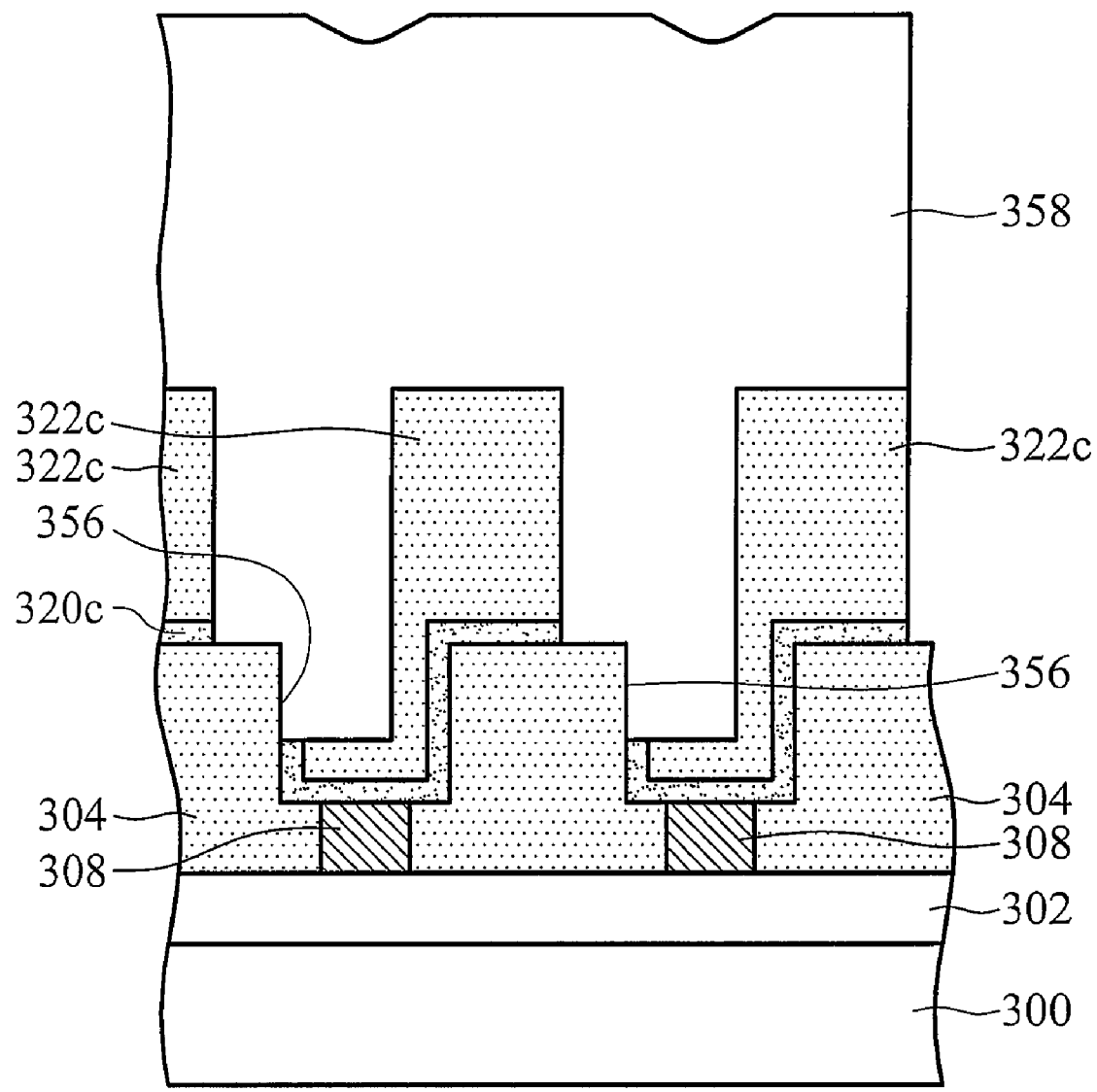

FIGS. 21a, 21b and 21c illustrate forming an insulating layer 358 by filling the opening 356. In the second embodiment, the insulating layer 358 may comprise silicon dioxide or other oxides.

Figure 22A:
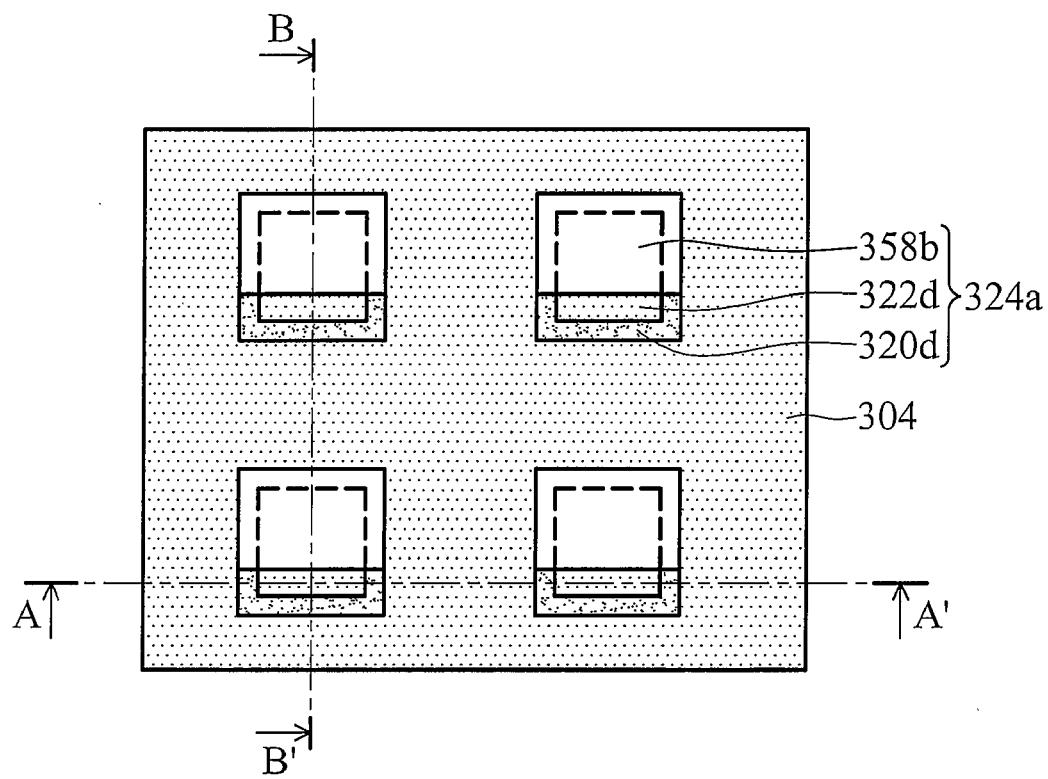
Figure 22B:
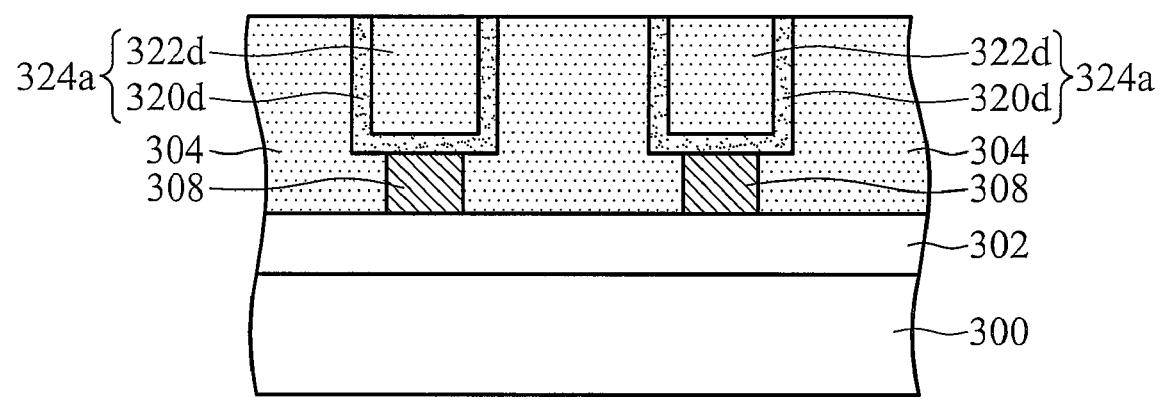
Figure 22C:
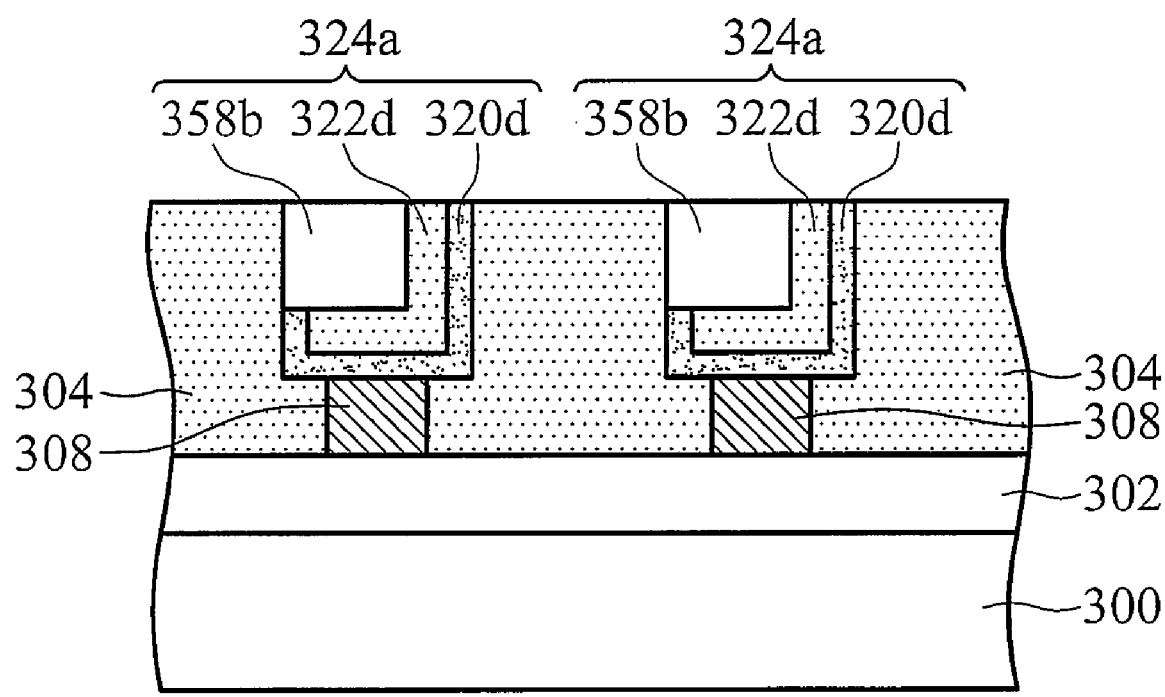

Next, a planarizing process such as chemical mechanical polishing (CMP) is performed to remove the excess conductive layer 320c and the insulating layers 322c and 358 until the dielectric layer 304 is exposed. A cup-shaped heating electrode 324a is thus formed. The cup-shaped heating electrode 324a comprises a conductive layer 320d, an insulating layer 322d and an insulating layer 358b. The cup-shaped heating electrode 324a is electrically connected to the first electrode layer 302 through the switching element 308. In the second embodiment, the conductive layer 320d is U-shaped from the top view as shown in FIG. 22a.

Figure 23A:
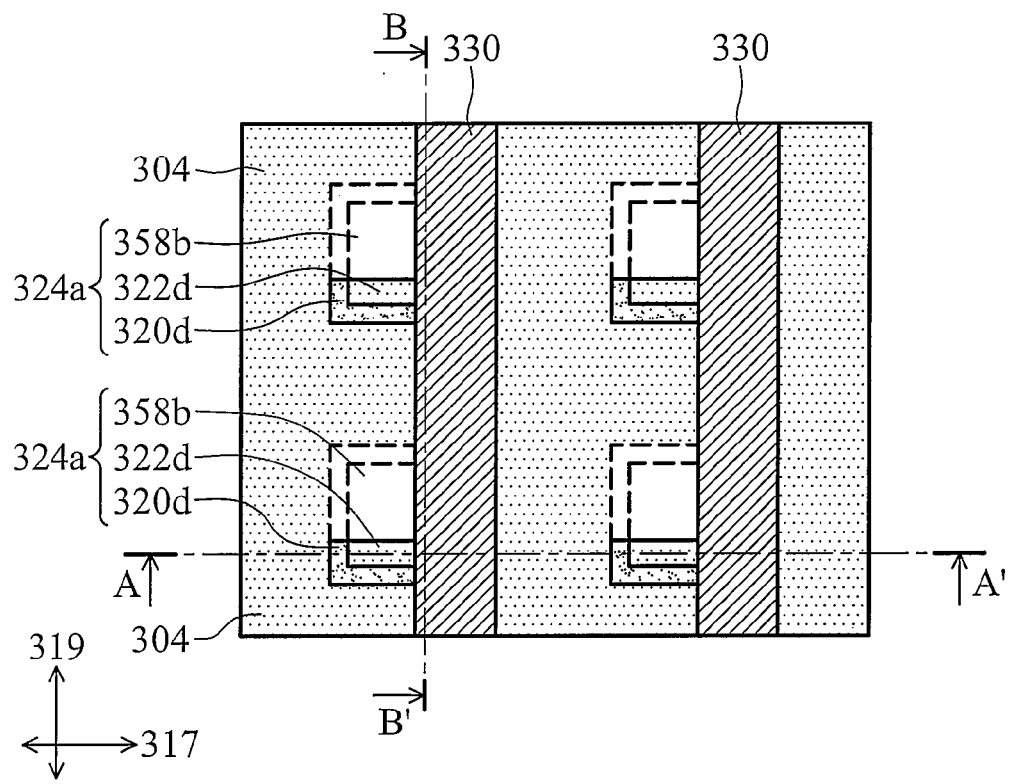
Figure 23B:
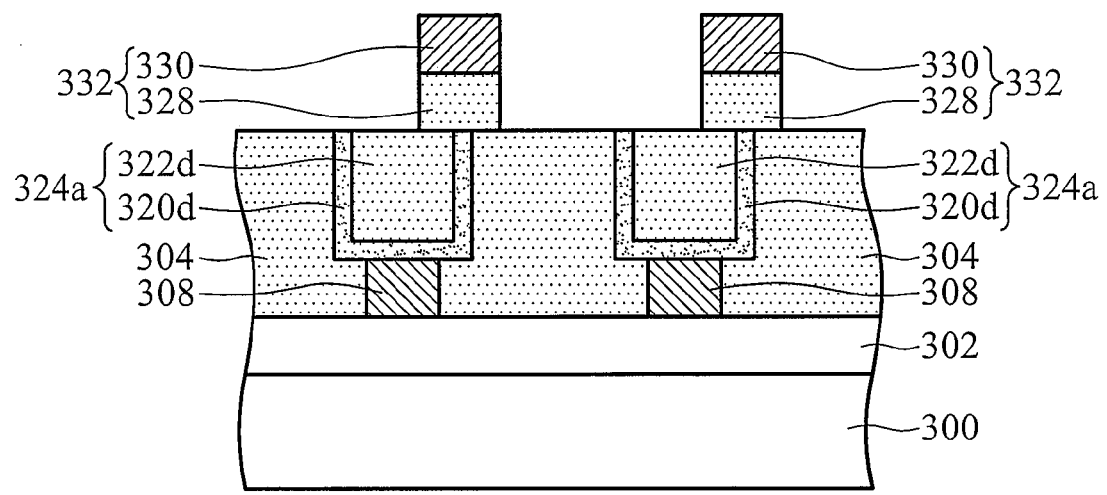
Figure 23C:
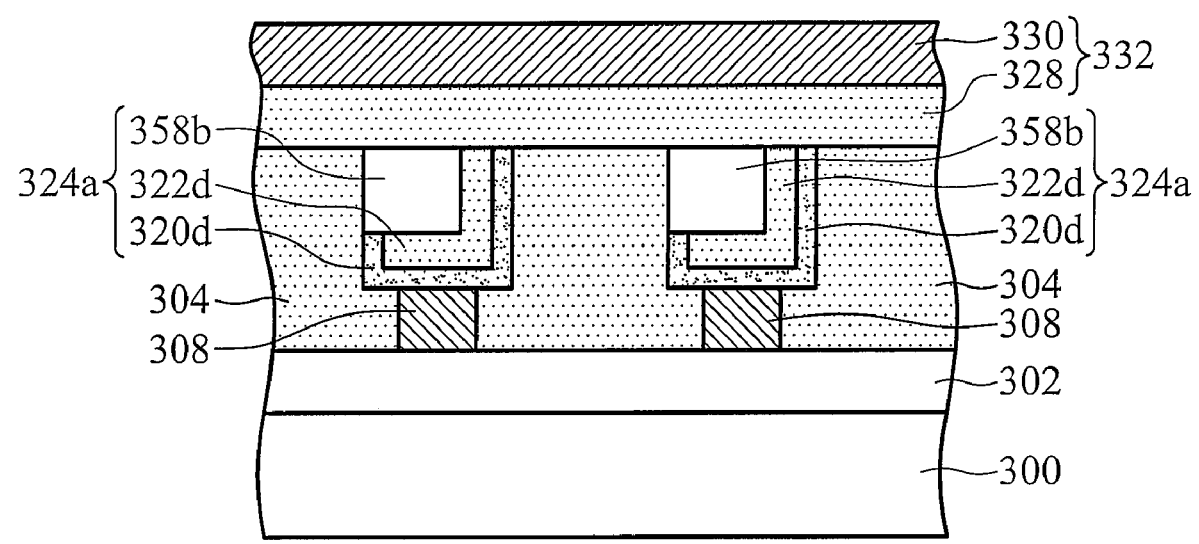

FIGS. 23a, 23b and 23c illustrate formation of a stacked structure 332. An insulating layer and a conductive layer are sequentially formed on the dielectric layer 304 and the cup-shaped heating electrode 324a. The insulating layer of the second embodiment may comprise silicon oxide ($SiO_x$), silicon nitride ($SiN_y$) or combinations thereof. The conductive layer may comprise metals, alloys, metal compounds, semiconductor materials or combinations thereof. The conductive layer may comprise basic metals or alloys thereof (such as Cu or Al), refractory metals or alloys thereof (such as Co, Ta, Ni, Ti, W or TiW), transitional metal nitrides, refractory metal nitrides (such as CoN, TaN, NiN, TiN or WN), nitride metal silicides (such as $CoSi_mN_n$, $TaSi_mN_n$, $NiSi_mN_n$, $TiSi_mN_n$ or $WSi_mN_n$), metal silicides (such as $CoSi_z$, $TaSi_z$, $NiSi_z$, $TiSi_z$, $WSi_z$, polycrystalline semiconductor materials, amorphous semiconductor materials, phase change materials (such as GaSb, GeTe, $Ge_2Sb_2Te_5$ or Ag—In—Sb—Te), conductive oxide materials (such as yttrium barium copper oxide (YBCO), $Cu_2O$, indium tin oxide (ITO)) or combinations thereof. The conductive layer may be a single layer or a composite layer formed by the aforementioned materials with an arbitrary sequence or layer number. Next, a patterned photoresist (not shown) is used to cover the conductive layer for defining the position of the stacked structure 332. An anisotropic etching process is performed to remove the conductive layer and the insulating layer not covered by the patterned photoresist. The patterned photoresist is then removed to form the stacked structure 332. The stacked structure 332 comprises an insulating layer 328 and a conductive layer 330 (serving as a top electrode layer 330) formed on the dielectric layer 304 along a second direction 319. The stacked structure 332 also covers a portion of the cup-shaped heating electrode 324a. In one embodiment, the first direction 317 is substantially perpendicular to the second direction 319. The insulating layer 328 preferably has an etching selectivity of about 5 to 1000 with the insulating layers 322d and 358 of the underlying cup-shaped heating electrode 324a. Preferably, the stacked structure 332 covers one of two parallel edges along the second direction 319 of the cup-shaped heating electrode 324a, for example, one half of the cup-shaped heating electrode 324a. The insulating layer 328 and the conductive layer 322 each have a preferable thickness of about 100 nm respectively.

Figure 24A:
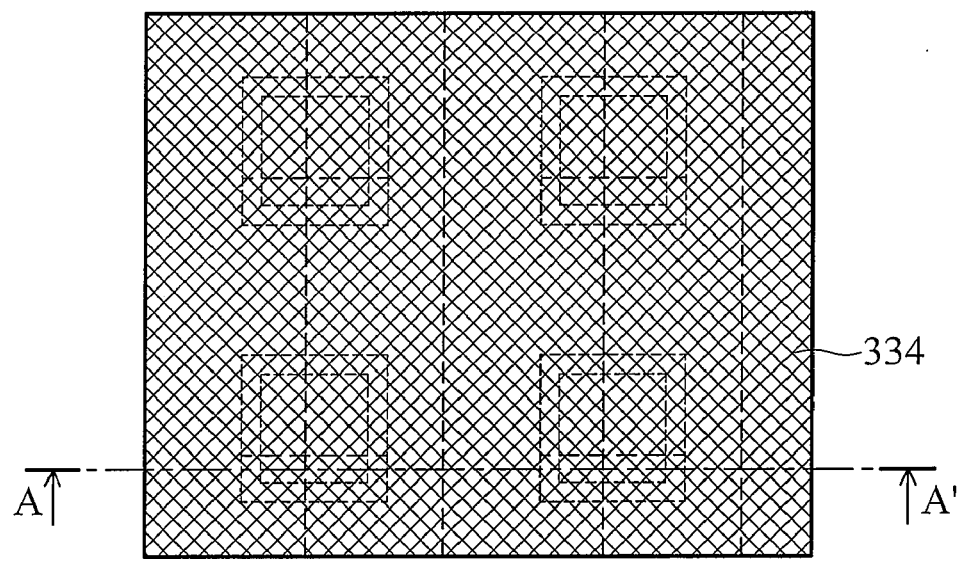
Figure 24B:
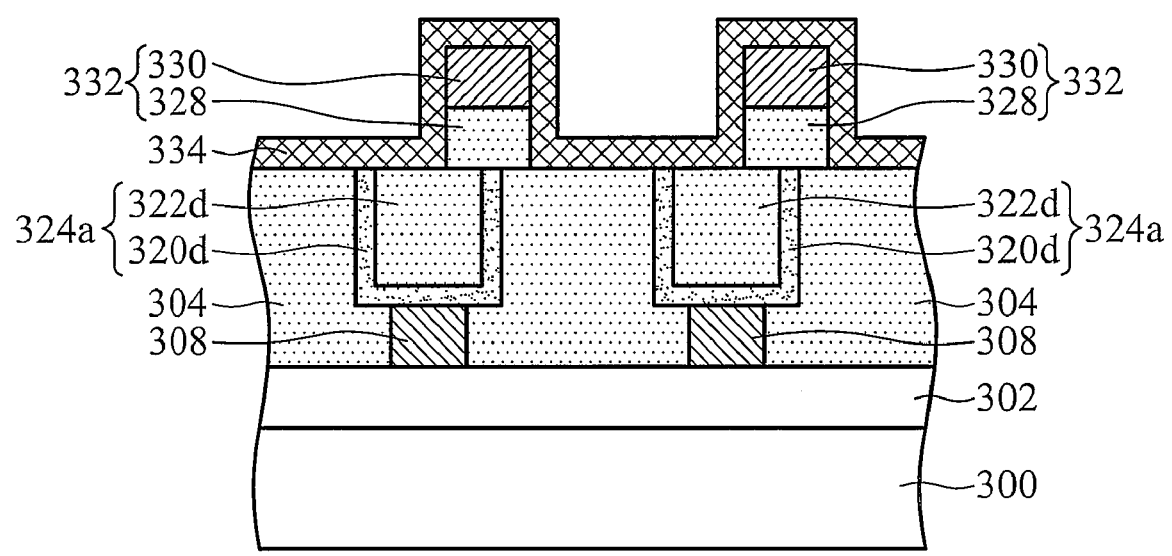

FIGS. 24a and 24b illustrate an embodiment of forming a phase change material layer 334. The phase change material layer 334 is blanketly deposited over the entire region by physical vapor deposition (PVD), thermal evaporation, pulsed laser deposition or metal organic chemical vapor deposition (MOCVD). The phase change material 334 may comprise binary, ternary or tetra chalcogenide such as GaSb, GeTe, Ge—Sb—Te (GST) alloy, Ag—In—Sb—Te alloy or combination thereof. In the second embodiment, the phase change material layer 334 preferably has a thickness of about 10 nm to 50 nm. The thickness of the phase change material layer 334 may be up to 100 nm if the cup-shaped opening 318 has a larger aperture as shown in FIGS. 16a and 16b to meet phase change memory requirements.

Figure 25A:
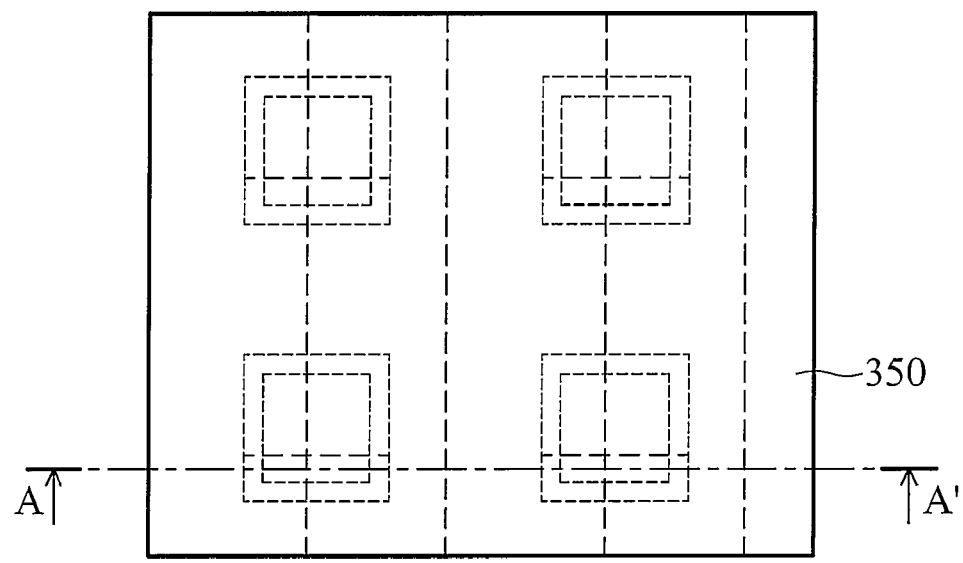
Figure 25B:
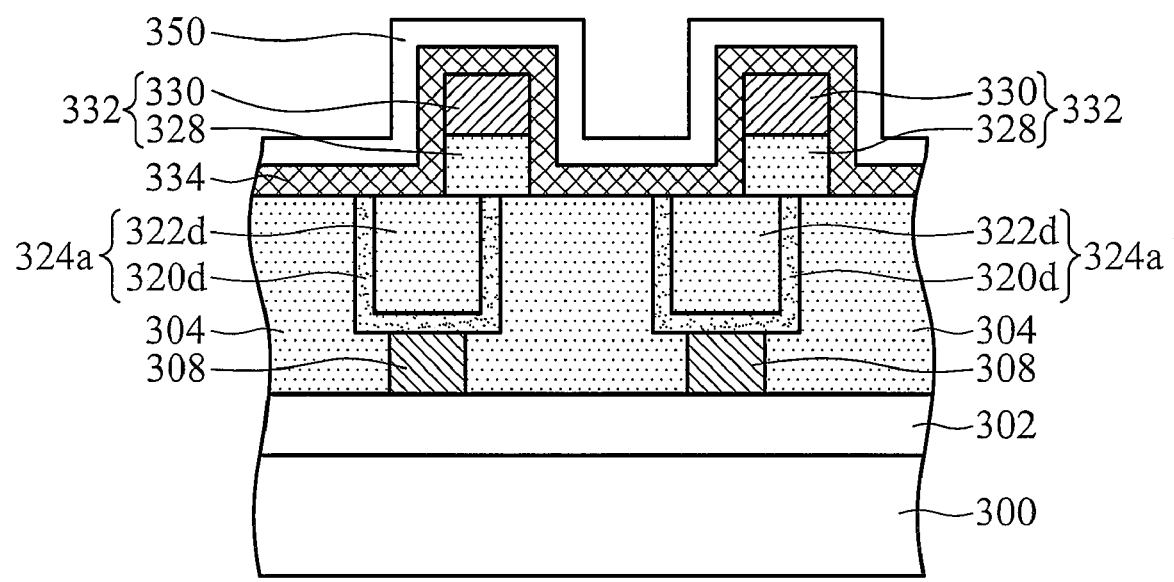

Referring to FIGS. 25a and 25b, an insulating material layer 350 is formed covering the phase change material layer 334 by plasma enhanced chemical vapor deposition (PECVD). The insulating material layer 350 may comprise oxide or nitride with a preferable thickness of about 10 nm to 50 nm.

Figure 26A:
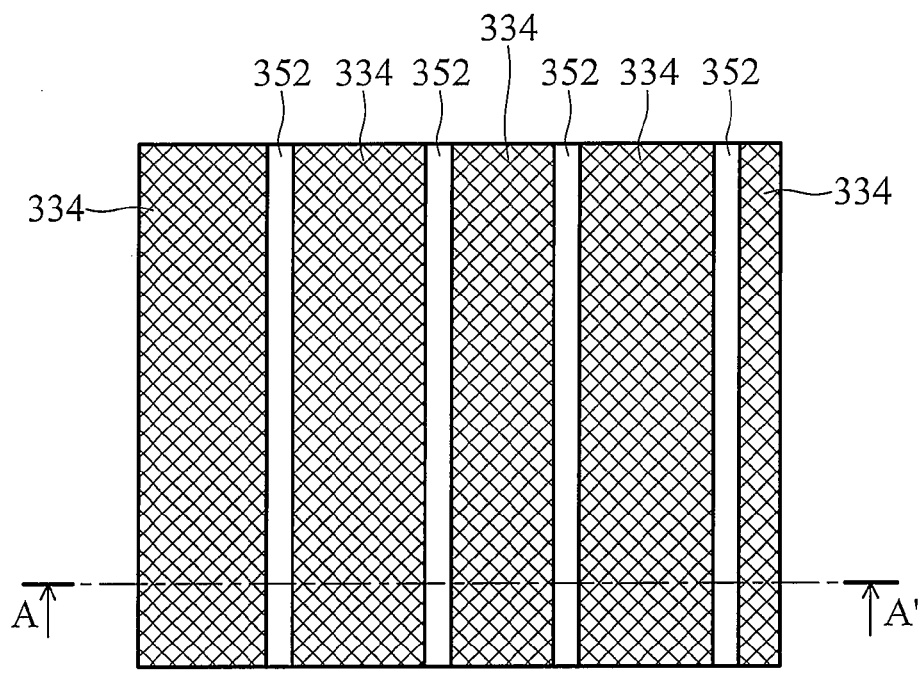
Figure 26B:
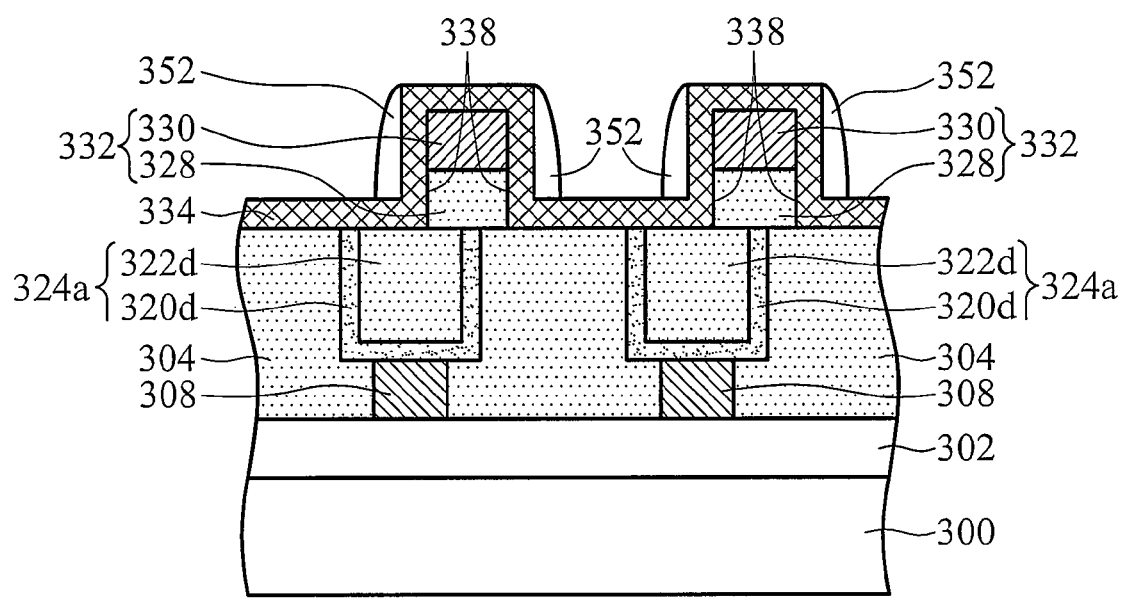

Referring to FIGS. 26a and 26b, an anisotropic etching is performed to remove a portion of the insulating material layer 350. Insulating material spacers 352 are thus formed above sidewalls 338 of the stacked structures 332. The phase change material layer 334 preferably has an etching selectivity of about 1 to 1000 with the insulating material layer 350.

Figure 27A:
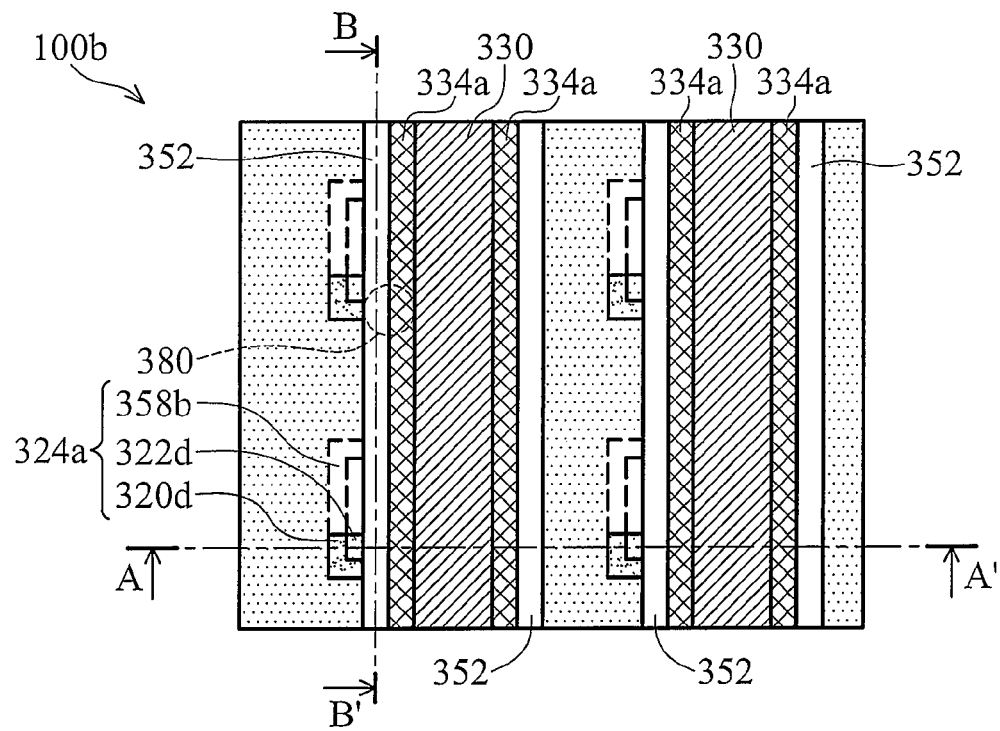
Figure 27B:
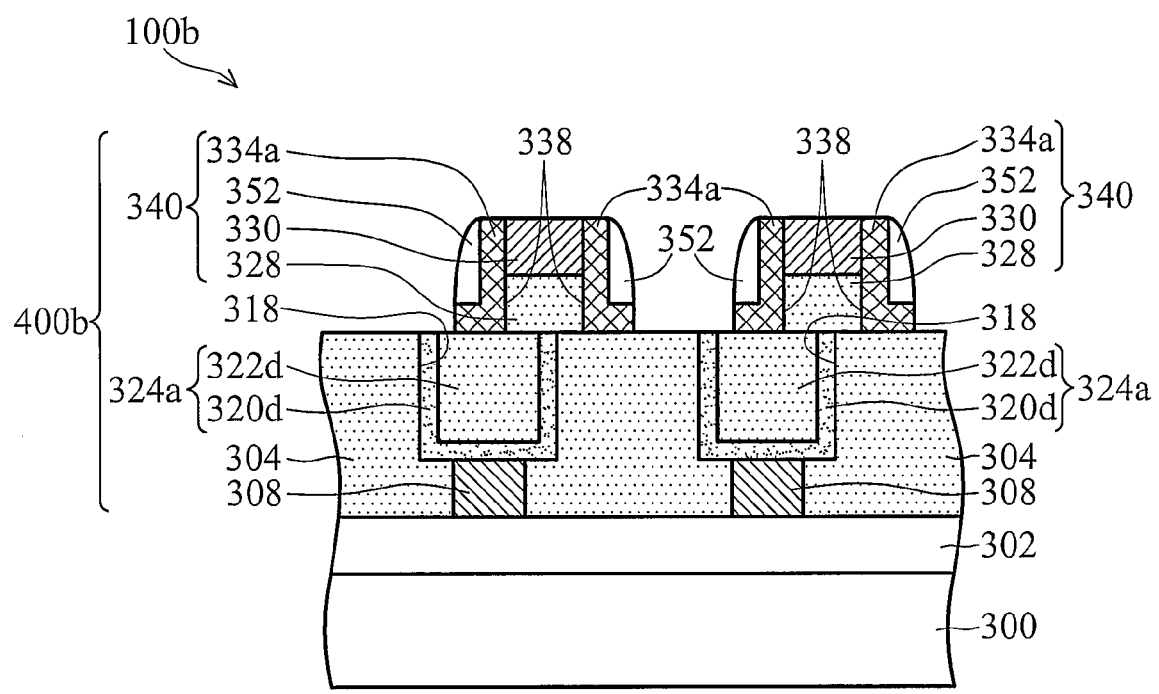
Figure 27C:
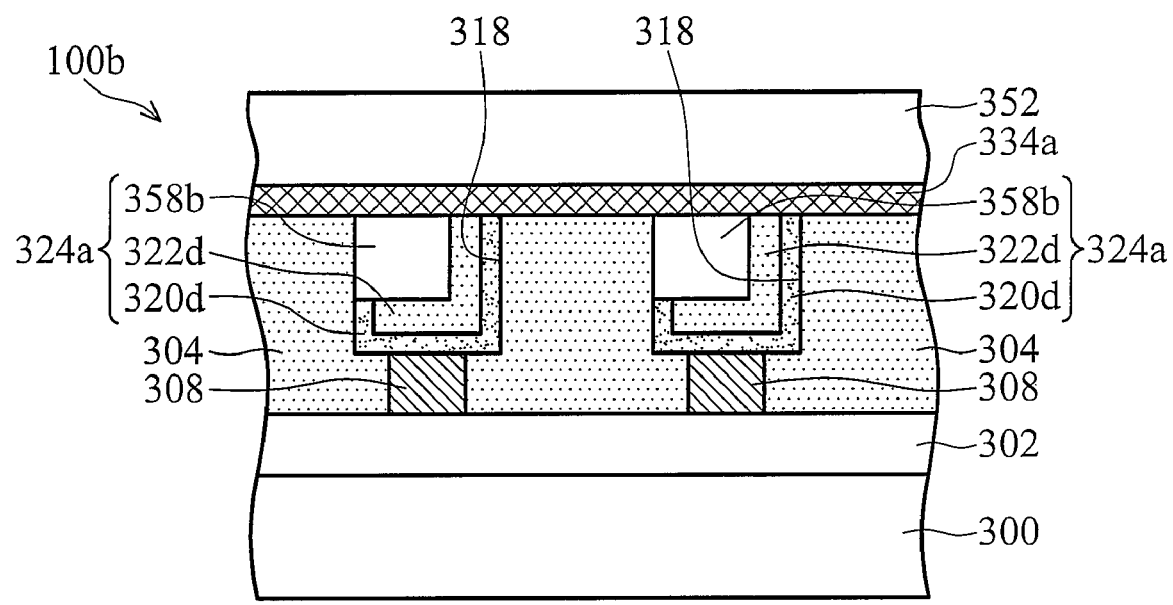

Referring to FIGS. 27a, 27b and 27c, an anisotropic etching is performed to remove a portion of the insulating material spacers 352, the phase change material layer 334 not covered by the insulating material spacers 352 to form phase change material spacers 334a. And an electrode structure 340 comprises double spacers of the insulating material spacers 352 and the phase change material spacers 334a are thus formed. The electrode structure 340 comprises the insulating layer 328, the conductive layer 322, the insulating material spacers 352 and the phase change material spacers 334a. A phase change memory structure 400b is thus completely formed. Subsequent to the fabrication processes, the second embodiment of a phase change memory device 100b is thus completely formed. An intersecting area of the phase change material spacer 334a and the conductive layer 320d controls a contact area 380a between the phase change material spacer 334a and the cup-shaped heating electrode 324a. Compared to the conventional process, the size of the contact area 380 is smaller and more precisely controlled.

For the phase change memory device 10b, the insulating material spacer 352 covers the phase change material spacer 334a of the electrode structure 340. The phase change material spacer 334a formed by etching the phase change material layer 334 can be free from damage due to the insulating material spacer 352 covering. Conventional phase material spacers suffer from surface damage due to a metal-based polymer residue formed on edges of the phase material layer or by etching gas attack during the phase material layer etching process. Conventional phase change memory performance is thus affected even if the phase change phenomenon does not occur. In the phase change memory device 10b, the metal-based polymer residue or the etching gas attack region can be separated from the contact area 380 between the phase change material spacer 334a and the cup-shaped heating electrode 324a by the insulating material spacer 352. Thus, phase change memory device performance and yield may be improved.

Alternatively, a dielectric layer is blanketly deposited covering the phase change memory structure 400b. A planarizing process such as chemical mechanical polishing (CMP) is then performed to remove the excess dielectric layer until the conductive layer 330 of the electrode structure 340 is exposed. Next, several phase change memory structures 400b are perpendicularly stacked and electrically connected to form a 3-dimensional (3D) memory array by repeating the processes as shown in FIGS. 16a, 16b to 27a~27c. The number of the phase change memory devices 400b is not limited.

The second exemplary embodiment of the phase change memory device 100b mainly comprises: a substrate 300; an electrode layer 302 formed on the substrate 300; a dielectric layer 304 formed on the electrode layer 302; a phase change memory structure 400b formed in the dielectric layer 304 and electrically connected to the electrode layer 302. The phase change memory structure 400b comprises a cup-shaped heating electrode 324a placed in a cup-shaped opening 318 in the dielectric layer 304. The cup-shaped heating electrode 324a comprises: a conductive layer 320d covering a portion of a sidewall of the cup-shaped heating electrode 324a; an electrode structure 340 placed on the cup-shaped heating electrode 324a and covering a portion of the cup-shaped heating electrode 324a; a pair of double spacers placed on a pair of sidewalls of the electrode structure 340 and covering a portion of the cup-shaped heating electrode 324a. The double spacer comprises a phase change material spacer 334a and an insulating material spacer 352 placed on a sidewall of the phase change material spacer 334a.

The conductive layers of the cup-shaped heating electrodes of the phase change memory devices 100a and 100b are partially covered in different ways. In the phase change memory device 100a, the conductive layer 320a of the cup-shaped heating electrode 324 is partially covered by the insulating layer 326 along the first direction 317. And the conductive layer 320a has a square-ring shape from the top view. In the phase change memory device 10b, a portion of the insulating layer 322b and the conductive layer 320b are removed by the same mask used to form the photoresist layer 316 with an offset before forming the cup-shaped heating electrode 324a. The insulating layer 358 thus fills the cup-shaped heating electrode to form the shaped heating electrode 324a and partially covers the conductive layer 320d at the same time. A masking step for forming the covering insulating layer can be eliminated, and the conductive layer is U-shaped from the top view.

Advantages of the phase change memory device 100b are described in the following. The same mask is used for forming the conductive layer of the cup-shaped heating electrode and the cup-shaped heating electrode. A masking process for forming the covering insulating layer can be eliminated. The insulating layer of the stacked structure has an etching selectivity with the insulating layer inside or outside the cup-shaped heating electrode. Thus end point detection is easier. The fabrication process for the insulating layer covering the cup-shaped electrode is free from undesired phase change material spacers formed thereon. The stacked structure is formed on the cup-shaped heating electrode with a planar surface. The subsequent phase change material spacers are thus not required to cross a topographic surface, allowing stacked structure to be thinned without a breaking. The phase change material spacers are thus uniformly formed on the stacked structure, and phase change memory device is uniform.

While the invention has been described by way of example and in terms of the embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase change memory device, comprising:
   a substrate;
   an electrode layer formed on the substrate;
   a phase change memory structure formed on the electrode layer and electrically connected to the electrode layer, wherein the phase change memory structure comprises:
      a cup-shaped heating electrode placed on the electrode layer;
      an insulating layer placed on the cup-shaped heating electrode along a first direction covering a portion of the cup-shaped heating electrode;
      an electrode structure placed on the cup-shaped heating electrode along a second direction covering a portion of the insulating layer and the cup-shaped heating electrode;
      a pair of double spacers placed on a pair of opposite sidewalls of the electrode structure so as to be physically separated from each other by the electrode structure, wherein one of the pair of double spacers covers a portion of the cup-shaped heating electrode and another one of the pair of double spacers is free from contacting the cup-shaped heating electrode, wherein the double spacer comprises a phase change material spacer and an insulating material spacer placed on a sidewall of the phase change material spacer, arranged such that an intersecting area of the phase change material spacer of one of the pair of double spacers and a conductive layer of the cup-shaped heating electrode controls a contact area between the phase change material spacer and the cup-shaped heating electrode.

2. The phase change memory device as claimed in claim 1, the cup-shaped heating electrode further comprising:
   a switching element; and an insulating layer;
wherein the conductive layer of the cup-shaped heating electrode is placed on the switch element and electrically connected to the switching element, wherein the conductive layer is cup-shaped with a cup-shaped opening; and the insulating layer is placed on the conductive layer and filled in the cup-shaped opening.

3. The phase change memory device as claimed in claim 2, wherein the switching element comprises a diode structure or an interconnect structure.

4. The phase change memory device as claimed in claim 2, wherein the conductive layer of the cup-shaped heating electrode comprises metals, alloys, metal compounds, semiconductor materials or combinations thereof.

5. The phase change memory device as claimed in claim 4, wherein the metals comprise aluminum (Al), copper (Cu), cobalt (Co), tantalum (Ta), nickel (Ni), titanium (Ti), tungsten (W) or combinations thereof.

6. The phase change memory device as claimed in claim 4, wherein the alloys comprise aluminum-alloy, copper-alloy, cobalt-alloy, tantalum-alloy, nickel-alloy, titanium-alloy, tungsten-alloy, TiW, GaSb, GeTe, $Ge_2Sb_2Te_5$, Ag—In—Sb—Te or combinations thereof.

7. The phase change memory device as claimed in claim 4, wherein the metal compounds comprise CoN, TaN, NiN, TiN, WN, $CoSi_mN_n$, $TaSi_mN_n$, $NiSi_mN_n$, $TiSi_mN_n$, $WSi_mN_n$, Co-salicide ($CoSi_z$), Ta-salicide ($TaSi_z$), Ni-salicide ($NiSi_z$), Ti-salicide ($TiSi_z$), W-salicide ($WSi_z$), yttrium barium copper oxide (YBCO), $Cu_2O$, indium tin oxide (ITO) or combinations thereof.

8. The phase change memory device as claimed in claim 4, wherein the semiconductor materials comprise polycrystalline semiconductor material, amorphous semiconductor material or combinations thereof.

9. The phase change memory device as claimed in claim 1, wherein the conductive layer of the cup-shaped heating electrode has a square-ring shape from a top view.

10. The phase change memory device as claimed in claim 1, wherein the insulating layer covers one half of the cup-shaped heating electrode.

11. The phase change memory device as claimed in claim 1, wherein the electrode structure covers one quarter of the cup-shaped heating electrode.

12. The phase change memory device as claimed in claim 1, wherein the electrode structure is a composite layer comprising an insulating layer and a conductive layer.

13. The phase change memory device as claimed in claim 12, wherein the conductive layer of the electrode structure comprises metals, alloys, metal compounds, semiconductor materials or combinations thereof.

14. The phase change memory device as claimed in claim 13, wherein the metals comprise aluminum (Al), copper (Cu), cobalt (Co), tantalum (Ta), nickel (Ni), titanium (Ti), tungsten (W) or combinations thereof.

15. The phase change memory device as claimed in claim 13, wherein the alloys comprise aluminum-alloy, copper-alloy, cobalt-alloy, tantalum-alloy, nickel-alloy, titanium-alloy, tungsten-alloy, TiW, GaSb, GeTe, $Ge_2Sb_2Te_5$, Ag—In—Sb—Te alloy or combinations thereof.

16. The phase change memory device as claimed in claim 13, wherein the metal compounds comprise comprises CoN, TaN, NiN, TiN, WN, $CoSi_mN_n$, $TaSi_mN_n$, $NiSi_mN_n$, $TiSi_mN_n$, $WSi_mN_n$, Co-salicide ($CoSi_z$), Ta-salicide ($TaSi_z$), Ni-salicide ($NiSi_z$), Ti-salicide ($TiSi_z$), W-salicide ($WSi_z$), yttrium barium copper oxide (YBCO), $Cu_2O$, indium tin oxide (ITO) or combinations thereof.

17. The phase change memory device as claimed in claim 13, wherein the semiconductor materials comprise comprises polycrystalline semiconductor material, amorphous semiconductor material or combinations thereof.

18. The phase change memory device as claimed in claim 13, wherein the conductive layer of the electrode structure comprises a single layer or stacked layers.

19. The phase change memory device as claimed in claim 1, wherein the first direction is substantially perpendicular to the second direction.

20. The phase change memory device as claimed in claim 1, wherein the phase change material spacer and the insulating material spacer have an etching selectivity of about 1 to 1000.

21. The phase change memory device as claimed in claim 1, further comprising:
another phase change material structure stacked on the phase change material structure vertically and electrically connected each other.

22. A phase change memory device, comprising:
a substrate;
an electrode layer formed on the substrate;
a dielectric layer formed on the electrode layer;
a phase change memory structure formed in the dielectric layer and electrically connected to the electrode layer, wherein the phase change memory structure comprises:
a cup-shaped heating electrode placed in a cup-shaped opening in the dielectric layer, wherein the cup-shaped heating electrode comprises a conductive layer covering a portion of a sidewall of the cup-shaped heating electrode;
an electrode structure placed on the cup-shaped heating electrode and covering a portion of the cup-shaped heating electrode;
a pair of double spacers placed on a pair of opposite sidewalls of the electrode structure so as to be physically separated from each other by the electrode structure, wherein one of the pair of double spacers covers a portion of the cup-shaped heating electrode and another one of the pair of double spacers is free from contacting the cup-shaped heating electrode, wherein the double spacer comprises a phase change material spacer and an insulating material spacer placed on a sidewall of the phase change material spacer, arranged such that an intersecting area of the phase change material spacer of one of the pair of double spacers and the conductive layer controls a contact area between the phase change material spacer and the cup-shaped heating electrode.

23. The phase change memory device as claimed in claim 22, the cup-shaped heating electrode further comprising:
a switching element placed under the conductive layer and electrically connected to the conductive layer; and
an insulating layer placed on the conductive layer and filled in the cup-shaped opening, wherein the insulating layer covers a portion of the sidewall of the cup-shaped opening.

24. The phase change memory device as claimed in claim 23, wherein the switching element comprises a diode structure or an interconnect structure.

25. The phase change memory device as claimed in claim 22, wherein the conductive layer comprises metals, alloys, metal compounds, semiconductor materials or combinations thereof.

26. The phase change memory device as claimed in claim 25, wherein the metals comprise aluminum (Al), copper (Cu), cobalt (Co), tantalum (Ta), nickel (Ni), titanium (Ti), tungsten (W) or combinations thereof.

27. The phase change memory device as claimed in claim 25, wherein the alloys comprise aluminum-alloy, copper-alloy, cobalt-alloy, tantalum-alloy, nickel-alloy, titanium-alloy, tungsten-alloy, TiW, GaSb, GeTe, $Ge_2Sb_2Te_5$, Ag—In—Sb—Te or combinations thereof.

28. The phase change memory device as claimed in claim 25, wherein the metal compounds comprise CoN, TaN, NiN, TiN, WN, $CoSi_mN_n$, $TaSi_mN_n$, $NiSi_mN_n$, $TiSi_mN_n$, $WSi_mN_n$, Co-salicide ($CoSi_z$), Ta-salicide ($TaSi_z$), Ni-salicide ($NiSi_z$), Ti-salicide ($TiSi_z$), W-salicide ($WSi_z$), yttrium barium copper oxide (YBCO), $Cu_2O$, indium tin oxide (ITO) or combinations thereof.

29. The phase change memory device as claimed in claim 25, wherein the semiconductor materials comprise polycrystalline semiconductor material, amorphous semiconductor material or combinations thereof.

30. The phase change memory device as claimed in claim 22, wherein the conductive layer is U-shaped from a top view.

31. The phase change memory device as claimed in claim 22, wherein the electrode structure covers half the cup-shaped heating electrode.

32. The phase change memory device as claimed in claim 22, wherein the electrode structure is a composite layer comprising an insulating layer and a conductive layer.

33. The phase change memory device as claimed in claim 32, wherein the conductive layer comprises metals, alloys, metal compounds, semiconductor materials or combinations thereof.

34. The phase change memory device as claimed in claim 33, wherein the metals comprise aluminum (Al), copper (Cu), cobalt (Co), tantalum (Ta), nickel (Ni), titanium (Ti), tungsten (W) or combinations thereof.

35. The phase change memory device as claimed in claim 33, wherein the alloys comprise aluminum-alloy, copper-alloy, cobalt-alloy, tantalum-alloy, nickel-alloy, titanium-alloy, tungsten-alloy, TiW, GaSb, GeTe, $Ge_2Sb_2Te_5$, Ag—In—Sb—Te alloy or combinations thereof.

36. The phase change memory device as claimed in claim 33, wherein the metal compounds comprise CoN, TaN, NiN, TiN, WN, $CoSi_mN_n$, $TaSi_mN_n$, $NiSi_mN_n$, $TiSi_mN_n$, $WSi_mN_n$, Co-salicide ($CoSi_z$), Ta-salicide ($TaSi_z$), Ni-salicide ($NiSi_z$), Ti-salicide ($TiSi_z$), W-salicide ($WSi_z$), yttrium barium copper oxide (YBCO), $Cu_2O$, indium tin oxide (ITO) or combinations thereof.

37. The phase change memory device as claimed in claim 33, wherein the semiconductor materials comprise polycrystalline semiconductor material, amorphous semiconductor material or combinations thereof.

38. The phase change memory device as claimed in claim 33, wherein the conductive layer comprises a single layer or stacked layers.

39. The phase change memory device as claimed in claim 32, further comprising:
   another phase change material structure stacked vertically on and electrically connected to the phase change material structure.

40. The phase change memory device as claimed in claim 22, wherein the phase change material spacer and the insulating material spacer have an etching selectivity of about 1 to 1000.

* * * * *